United States Patent
Nomura et al.

(10) Patent No.: US 10,908,333 B2
(45) Date of Patent: Feb. 2, 2021

(54) OPTICAL FILM, POLARIZATION PLATE, AND IMAGE DISPLAY DEVICE

(71) Applicant: DAI NIPPON PRINTING CO., LTD., Tokyo (JP)

(72) Inventors: Takahisa Nomura, Tokyo (JP); Takanori Hamada, Tokyo (JP); Masataka Nakashima, Tokyo (JP); Kentaro Hata, Tokyo (JP); Hiroshi Nakamura, Tokyo (JP); Hiroki Nakagawa, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 0 days.

(21) Appl. No.: 16/482,116

(22) PCT Filed: Jan. 30, 2018

(86) PCT No.: PCT/JP2018/002880
§ 371 (c)(1),
(2) Date: Jul. 30, 2019

(87) PCT Pub. No.: WO2018/143167
PCT Pub. Date: Aug. 9, 2018

(65) Prior Publication Data
US 2019/0391308 A1    Dec. 26, 2019

(30) Foreign Application Priority Data
Jan. 31, 2017   (JP) .................................. 2017-015454

(51) Int. Cl.
*H01L 27/00*    (2006.01)
*G02B 5/20*    (2006.01)
(Continued)

(52) U.S. Cl.
CPC .............. *G02B 5/208* (2013.01); *H01L 27/32* (2013.01); *H01L 51/5284* (2013.01)

(58) Field of Classification Search
CPC ... H01L 27/32; H01L 27/3211; H01L 27/322; H01L 27/3206; H01L 27/3244;
(Continued)

(56) References Cited

U.S. PATENT DOCUMENTS

| | | | | |
|---|---|---|---|---|
| 4,716,234 A | * | 12/1987 | Dunks | C08F 20/36 548/259 |
| 5,442,022 A | * | 8/1995 | Keita | C08F 220/30 522/178 |

(Continued)

FOREIGN PATENT DOCUMENTS

| | | |
|---|---|---|
| EP | 0080663 | 6/1983 |
| EP | 0605293 | 7/1994 |

(Continued)

OTHER PUBLICATIONS

International Search Report issued for International Patent Application No. PCT/JP2018/002880, dated Apr. 24, 2018, 5 pages including English translation.

(Continued)

*Primary Examiner* — Nikolay K Yushin
(74) *Attorney, Agent, or Firm* — Hamre, Schumann, Mueller & Larson, P.C.

(57) ABSTRACT

Provided is an optical film 10 including a light-transmitting base material 11 and a light-transmitting functional layer 12 provided on one surface of the light-transmitting base material 11, wherein the optical film 10 has a spectral transmittance of less than 1% at a wavelength of 380 nm, a spectral transmittance of 10% or more and less than 60% at a wavelength of 410 nm, and a spectral transmittance of 70% or more at a wavelength of 440 nm, and wherein the
(Continued)

light-transmitting functional layer 12 has a film thickness of 9 μm or less.

11 Claims, 5 Drawing Sheets

(51) Int. Cl.
*H01L 51/52* (2006.01)
*H01L 27/32* (2006.01)

(58) Field of Classification Search
CPC . H01L 51/5284; H01L 51/50; H01L 51/0072; H01L 51/006; H01L 51/5265; H01L 51/5215; H05B 33/02; H05B 33/14; H05B 33/28; G02B 5/30; G02B 5/208; G02B 5/22; G02F 1/1335; G02F 1/133528; G02F 1/13363; G02F 1/1333; G02F 1/133606; G09F 9/00
See application file for complete search history.

(56) References Cited

U.S. PATENT DOCUMENTS

| | | | | |
|---|---|---|---|---|
| 5,637,726 | A * | 6/1997 | Collins | C07D 249/20 548/259 |
| 7,691,918 | B2 * | 4/2010 | Jinkerson | A61L 27/16 351/159.06 |
| 9,933,635 | B2 * | 4/2018 | Hashimoto | G02B 5/208 |
| 2012/0243115 | A1 | 9/2012 | Takamiya et al. | |
| 2015/0370094 | A1 | 12/2015 | Hashimoto et al. | |
| 2016/0215121 | A1 | 7/2016 | Kousaka et al. | |
| 2017/0192146 | A1 * | 7/2017 | Yamada | G02F 1/133621 |

FOREIGN PATENT DOCUMENTS

| | | |
|---|---|---|
| JP | 06-145387 | 5/1994 |
| JP | H10186291 | 7/1998 |
| JP | 2000034464 | 2/2000 |
| JP | 2002082218 | 3/2002 |
| JP | 2006264312 | 10/2006 |
| JP | 2007152591 | 6/2007 |
| JP | 2008181097 | 8/2008 |
| JP | 2011164286 | 8/2011 |
| JP | 2013114184 | 6/2013 |
| JP | 2014010947 | 1/2014 |
| JP | 2014164111 | 9/2014 |
| JP | 2015191147 | 11/2015 |
| JP | 2015194799 | 11/2015 |
| JP | 2016184172 | 10/2016 |
| WO | 2011040541 | 4/2011 |
| WO | 2014133111 | 9/2014 |

OTHER PUBLICATIONS

International Preliminary Report on Patentability, issued in the corresponding PCT application No. PCT/JP2018/002880, dated Aug. 6, 2019, 11 pages.
Extended European Search Report, issued in the corresponding European patent application No. 18747204.8, dated Sep. 14, 2020, 8 pages.

* cited by examiner

OPTICAL FILM, POLARIZATION PLATE, AND IMAGE DISPLAY DEVICE

CROSS-REFERENCE TO RELATED APPLICATION

The present application is a national stage of PCT/JP2018/002880 (filed on Jan. 30, 2018), which enjoys the benefit of priority to the prior Japanese Patent Application No. 2017-15454 (filed on Jan. 31, 2017), the entire disclosure of which is incorporated herein by reference.

TECHNICAL FIELD

The present invention relates to an optical film, a polarizing plate, and an image display device.

BACKGROUND ART

Light emitting diodes (LEDs), are actively utilized in recent years as the backlight source for image display devices such as personal computers and tablet terminals, strongly emit a type of light called blue light.

Blue light has wavelengths from 380 to 495 nm and other properties similar to those of ultraviolet light, and the energy of blue light is so high that blue light not absorbed by the cornea and the crystalline lens but passing into the retina is considered as a cause of retinal damage, eye strain, sleep disorder, and the like. Thus, it is desirable that image display devices shield blue light.

As a method for solving such blue light problems, for example, a method of adding a pigment and an ultraviolet absorber to a light-transmitting base material or a light-transmitting functional layer as a component of optical films for use in image display devices and the like is contemplated (see, for example, Japanese Patent Application Publication No. 2014-10947).

Furthermore, a method of adding a pigment and/or an ultraviolet absorber to an adhesive layer as a component of optical films to shield ultraviolet and some visible lights, which are generated in the external environment, for inhibiting degradation of display panels is also contemplated.

SUMMARY OF THE INVENTION

However, the absorption wavelength range of the pigment and/or the ultraviolet absorber added to a light-transmitting base material or the like as a component of conventional optical films is a relatively narrow wavelength range mainly from 300 to 360 nm, which has caused the conventional optical films to have an insufficient ability to shield blue light.

On the other hand, light within a relatively long wavelength range of blue light gives some influence to the color of transmitted light, under which optical films may have a yellowish color due to excessive absorption of light within the relatively long wavelength range.

Furthermore, addition of the pigment and/or the ultraviolet absorber to an adhesive layer reduces the adhesion strength of the adhesive layer, which may cause separation or lifting of the adhesive layer from the adherend to occur during environmental tests. Thus, the film thickness of the adhesive layer is required to be 10 μm or more, which may in turn prevent optical films from becoming thinner.

In view of the above-described current situation, the present invention is aimed at providing an optical film capable of shielding blue light, reducing yellow color, and being thinner, and a polarizing plate and an image display device each comprising such an optical film.

The inventors intensively studied to solve the above-described problem and found that an optical film can achieve shielding of blue light and reduction of yellow color by allowing, in the wavelength range of blue light, light in the wavelength range below 380 nm to be absorbed well, light in the wavelength range around 410 nm to be moderately transmitted, and light in the wavelength range above 440 nm to be transmitted well by the optical film, and the optical film can also become thinner by containing a spectral transmittance modifier not in an adhesive layer but in a light-transmitting functional layer with a low film thickness, and thereby completed the present invention.

According to one aspect of the present invention, an optical film comprising a light-transmitting base material and a light-transmitting functional layer provided on one surface of the light-transmitting base material is provided, wherein the optical film has a spectral transmittance of less than 1% at a wavelength of 380 nm, a spectral transmittance of 10% or more and less than 60% at a wavelength of 410 nm, and a spectral transmittance of 70% or more at a wavelength of 440 nm, and wherein the light-transmitting functional layer has a film thickness of 9 μm or less.

With regard to the above optical film, the optical film may have a yellow index of 1 or more and 12 or less.

With regard to the above optical film, the optical film may have a blue light shielding rate of 30% or more.

With regard to the above optical film, the slope of the transmittance spectrum obtained by applying the least square method to the transmittance in the wavelength range from 410 nm to 420 nm may be 2 or more.

With regard to the above optical film, the arithmetical mean roughness (Ra) of the surface of the optical film may be less than 10 nm.

With regard to the above optical film, the surface of the optical film may be an uneven surface.

With regard to the above optical film, the light-transmitting functional layer may comprise a spectral transmittance adjustment layer that contains a resin and a spectral transmittance modifier.

With regard to the above optical film, the light-transmitting functional layer may comprise a spectral transmittance adjustment layer and an overcoat layer provided opposite to the light-transmitting base material across the spectral transmittance adjustment layer.

With regard to the above optical film, the light-transmitting functional layer may comprise a spectral transmittance adjustment layer and a laminate structure consisting of multiple deposition layers that are provided opposite to the light-transmitting base material across the spectral transmittance adjustment layer.

With regard to the above optical film, the light-transmitting functional layer may comprise a spectral transmittance adjustment layer and a laminate structure consisting of multiple invisible layers that are provided on the surface of the spectral transmittance adjustment layer opposite to the surface attached to the light-transmitting base material and have mutually different refractive indexes.

With regard to the above optical film, the light-transmitting functional layer may comprise a spectral transmittance adjustment layer and a low refractive index layer that is provided opposite to the light-transmitting base material across the spectral transmittance adjustment layer and has a refractive index lower than that of the spectral transmittance adjustment layer.

According to another aspect of the present invention, a polarizing plate comprising the above optical film and a polarizer provided on one surface of the optical film is provided.

According to still another aspect of the present invention, an image display device comprising a display element and the above optical film or polarizing plate placed on the observer's side of the display element is provided.

In the above image display device, the display element is an organic light-emitting diode display element.

By one aspect of the present invention, an optical film capable of shielding blue light, reducing yellow color, and being thinner can be provided. By other aspects of the present invention, a polarizing plate and an image display device each comprising such an optical film can also be provided.

DETAILED DESCRIPTION OF THE INVENTION

Figure 1:
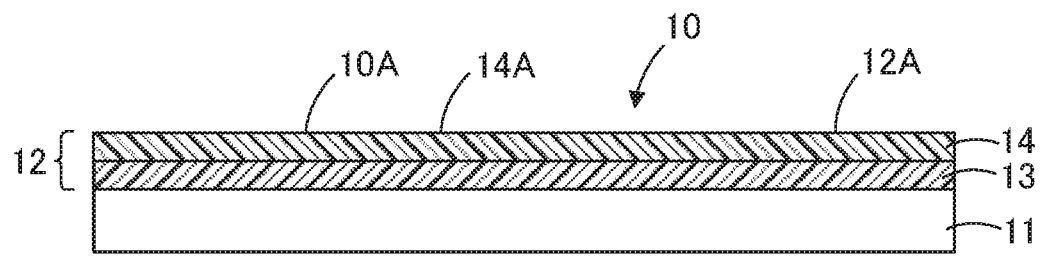
FIG. 1 depicts the schematic diagram of an optical film according to the embodiment.
Figure 2:
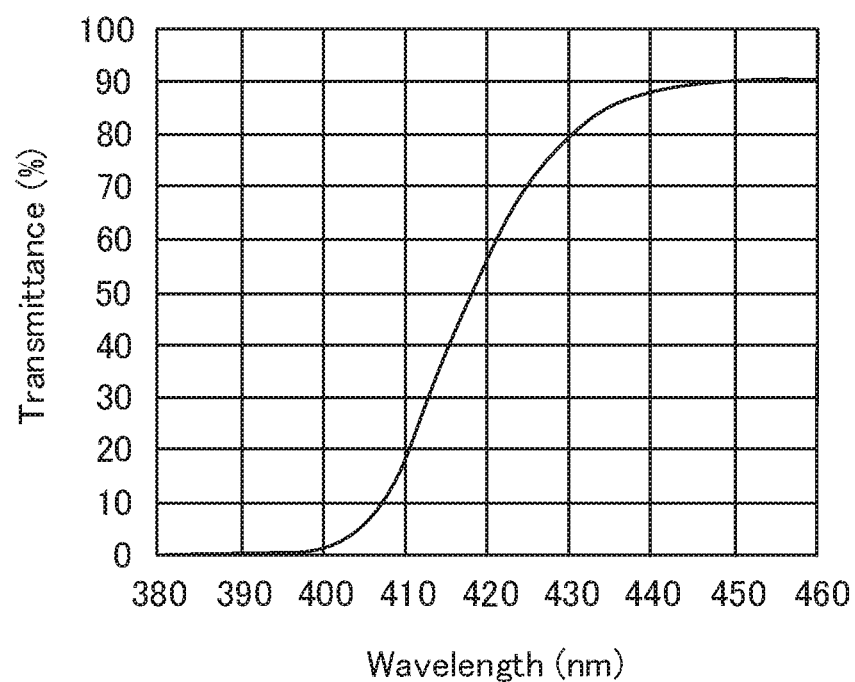
FIG. 2 depicts a graph illustrating an example of the spectral transmittance of the optical film according to the embodiment.

Now, an optical film and an image display device according to the embodiment of the present invention will be described below with reference to the drawings. In this specification, the terms "film" and "sheet" are not distinguished from each other on the basis of the difference of names alone. For example, the term "film" is thus used to refer inclusively to a member called "sheet." FIG. 1 depicts the schematic diagram of an optical film according to the embodiment, and FIG. 2 depicts a graph illustrating an example of the spectral transmittance of the optical film according to the embodiment. FIG. 3 and FIGS. 5 to 7 depict the schematic diagrams of other optical films according to the embodiment, and FIG. 4 explains a method for measurement of ea.

<<<<Optical Film>>>>

The optical film 10 shown in FIG. 1 has a spectral transmittance of less than 1% at a wavelength of 380 nm, a spectral transmittance of 10% or more and less than 60% at a wavelength of 410 nm, and a spectral transmittance of 70% or more at a wavelength of 440 nm. An optical film having a spectral transmittance of 1% or more at a wavelength of 380 nm has a reduced blue light shielding rate, which may result in failure in resolution of blue light problems. Additionally, an optical film having a spectral transmittance of less than 10% at a wavelength of 410 nm may fail to reduce yellow color, and an optical film having a spectral transmittance of 60% or more at a wavelength of 410 nm fails to resolve blue light problems, which may cause the transmitted light to exert adverse effects. The optical film having a spectral transmittance of less than 70% at a wavelength of 440 nm has a high yellow index and is yellow in color, and also has a reduced transmittance in the visible light range, which may not fit the properties of the optical film.

The spectral transmittance of an optical film should be determined by cutting out a piece of 50 mm×50 mm from the optical film, placing the resulting piece of film into a spectrophotometer capable of measuring the transmittance at 0.5% of pitch (product name "UV-2450"; manufactured by Shimadzu Corporation; light source: tungsten and deuterium lamps) in such a manner that the light-transmitting base material of the optical film faces toward the light source, measuring the transmittance at minimally five points spanning a 1 nm range centered at each wavelength of 380 nm, 410 nm, and 440 nm under the following measurement conditions, and calculating the averages of the values. The arithmetical means of three measurements each at wavelengths of 380 nm, 410 nm, and 440 nm are determined as the spectral transmittances at the wavelengths. Additionally, in cases where waviness is observed in the spectral transmittance curve, the curve may be smoothed with a delta of 5.0 nm.

(Measurement Conditions)
Wavelength range: 300 nm to 780 nm
Scan speed: high
Slit width: 2.0
Sampling interval: auto (an interval of 0.5 nm)
Illumination: C
Light source: D2 and WI
Visual field: 2°
Light source switching wavelength: 360 nm
SIR switching: standard
Detector: PM
Auto-zero: performed at 550 nm after baseline scan.

The optical film 10 is indicated to have a light transmittance of nearly 0% in the wavelength range up to 380 nm and to show a gradual increase in light transmission in the wavelength range above 410 nm and a sharp increase in light transmission in the wavelength range around 440 nm. Specifically, for example, the spectral transmittance of the optical film 10 varies sigmoidally in the wavelength range from 380 nm to 440 nm, as shown in FIG. 2.

The optical film 10 preferably has a spectral transmittance of less than 0.5%, more preferably less than 0.2%, at a wavelength of 380 nm in terms of shielding more blue light. The optical film 10 preferably has a minimum spectral transmittance of more than 10%, more preferably 13% or more, further preferably 15% or more, at a wavelength of 410 nm in terms of further reducing yellow color. The optical film 10 preferably has a maximum spectral transmittance of less than 58%, more preferably 55% or less, at a wavelength of 410 nm in terms of exhibiting an ability to shield blue light. The optical film 10 preferably has a spectral transmittance of 75% or more, more preferably 80% or more, at a wavelength of 440 nm in terms of inhibiting reduction in visibility due to coloration and ensuring transparency.

The optical film 10 preferably has a spectral transmittance of 45% or more and 70% or less at a wavelength of 420 nm. By limiting the spectral transmittance at a wavelength of 420 nm to a value within the above range, exhibition of an ability to shield blue light, inhibition of reduction in visibility due to coloration, and insurance of transparency can be achieved. The spectral transmittance of the optical film 10 at a wavelength of 420 nm should be measured in the same manner as the spectral transmittance at, for example, a wavelength of 380 nm.

In the optical film 10, the spectral transmittance in the wavelength range from 480 nm to 780 nm is preferably not reduced by 10% or more compared with the maximum spectral transmittance in the wavelength range from 400 to 450 nm. Although a pigment having a different absorption wavelength range and absorbing light in the wavelength range from 480 to 780 nm can be added to a spectral transmittance adjustment layer to reduce the below-described yellow index, addition of such a pigment having a different absorption wavelength range results in a decrease of light transmission in the wavelength range from 480 nm to 780 nm to cause a reduction of spectral transmittance. On the other hand, a low yellow index can be achieved in the optical film 10 without adding such a pigment having a different absorption wavelength range to the below-described spectral transmittance adjustment layer 13. The spectral transmittance should be determined by cutting out a piece of 50 mm×50 mm from the optical film, placing the resulting piece of film into a spectrophotometer capable of measuring the transmittance at 0.5% of pitch (product name "UV-2450"; manufactured by Shimadzu Corporation; light source: tungsten and deuterium lamps) in such a manner that the light-transmitting base material of the optical film faces toward the light source, measuring the transmittance at minimally five points spanning a 1 nm range centered at each wavelength in the range from 300 to 480 nm and the transmittance at all detection points spanning a 20 nm range centered at each wavelength in the wavelength range from 480 nm to 780 nm to correct noise in transmittance caused by film interference, and calculating the averages of the values. Furthermore, the conditions for measuring the spectral transmittance are the same as the above-described conditions for measuring the spectral transmittance at wavelengths of 380 nm, 410 nm, and 440 nm.

In cases where an additional film, such as polarizing plate; is provided to an optical film through an adhesive or adhesion layer, the spectral transmittance should be measured at wavelengths of 380 nm, 410 nm, 420 nm, and 440 nm after removing the additional film and the adhesive or adhesion layer. The additional film can be removed, for example, as follows. First of all; a laminate consisting of an optical film attached to an additional film through an adhesive or adhesion layer is heated with a hair dryer and is slowly separated by inserting a cutter blade into a possible interface between the optical film and the additional film. By repeating such a process of heating and separation; the adhesive or adhesion layer and the additional film can be removed. Even if such a removal process is performed, measurement of the spectral transmittance is not significantly affected.

The optical film 10 preferably has a yellow index (YI) of 1 or more and 12 or less. In cases where the optical film has a YI of less than 1, the optical film may have a reduced blue light shielding rate; additionally, in cases where the optical film has a YI of more than 12, the optical film is so yellow that the optical film is unlikely to be applicable to uses that require the optical film to be transparent. The yellow index (YI) is obtained by cutting out a piece of 50 mm×50 mm from an optical film, placing the resulting piece of film into a spectrophotometer (product name "UV-2450"; manufactured by Shimadzu Corporation; light source: tungsten and deuterium lamps) in such a manner that the light-transmitting base material of the optical film faces toward the light source, measuring the transmittance of the optical film in the wavelength range from 300 nm to 780 nm, calculating color tristimulus values X, Y, and Z from the obtained values of transmittance based on the formula described in JIS Z8722: 2009, and calculating a yellow index from the obtained tristimulus values X, Y, and Z based on the formula described in ASTM D1925: 1962. The transmittance in the wavelength range from 300 nm to 780 nm is measured three times for each optical film to calculate three yellow index values, and the arithmetical mean of the three calculated values is defined as the yellow index (YI) of the optical film. In the UV-2450, the yellow index is calculated from the loaded measurement data of the above-described transmittance on a monitor screen connected to the UV-2450, where the calculation starts with selecting the "YI" item from the calculation menu. The conditions for measuring the transmittance in the wavelength range from 300 nm to 780 nm are the same as the above-described conditions for measuring the spectral transmittance at wavelengths of 380 nm, 410 nm, and 440 nm. As the lower limit of YI, a lower value is normally preferred in terms of ensuring a high level of transparency; and a YI of 2 or more, or 3 or more, is more preferred in view of further imparting blue light cutting function (a larger numerical value is more preferable). However, an excessively high YI may in turn enhance yellow color. Thus, the upper limit of YI is more preferably 10 or less, 7 or less, or 6 or less (a smaller numerical value is more preferable).

Additionally, in cases where an additional film, such as polarizing plate, is provided to an optical film through an adhesive or adhesion layer, the yellow index (YI) should be measured after removing the additional film and the adhesive or adhesion layer by the same procedure as described above. Even if such a removal process is performed, measurement of the yellow index (YI) is not significantly affected.

The optical film 10 preferably has a blue light shielding rate of 30% or more. In cases where the blue light shielding rate is less than 30%, it may not be possible to fully resolve the aforementioned blue light problems. Such a blue light shielding rate can be achieved, for example, by adding a sesamol-type benzotriazole monomer as described below to the spectral transmittance adjustment layer 13. The above-described blue light shielding rate is calculated according to JIS T7333: 2005 and should be determined as follows. First of all, a piece of 50 mm×50 mm is cut from an optical film and placed into a spectrophotometer capable of measuring the transmittance at 0.5% of pitch (product name "UV-2450"; manufactured by Shimadzu Corporation; light source: tungsten and deuterium lamps) in such a manner that the base material of the optical film faces toward the light source, measuring the transmittance at minimally five points spanning a 1 nm range centered at each wavelength in the wavelength range from 380 nm to 495 nm, and calculating the averages of the values to determine the spectral transmittances in the wavelength range from 380 nm to 495 nm. Then, the blue light cut-off rate is determined with the following equation, where A represents the blue light cut-off rate (%) and B represents the mean transmittance (%) in the wavelength range from 380 nm to 495 nm. The arithmetical mean of three measurements is determined as the blue light shielding rate. Additionally, the conditions for measuring the spectral transmittance are the same as the above-described conditions for measuring the spectral transmittance at wavelengths of 380 nm, 410 nm, and 440 nm.

$$A=100-B$$

Additionally, in cases where an additional film, such as polarizing plate, is provided to an optical film through an adhesive or adhesion layer, the blue light shielding rate should be measured after removing the additional film and the adhesive or adhesion layer by the same procedure as described above. Even if such a removal process is performed, measurement of the blue light shielding rate is not significantly affected.

In the optical film 10, the slope of the transmittance spectrum obtained by applying the least square method to the transmittance in the wavelength range from 410 nm to 420 nm is preferably 2 or more. In cases where the above-described slope is 2 or more, the optical film can cut plenty of light in the blue light wavelength range, such as the wavelength range from 380 nm to 495 nm. Additionally, in cases where light in the blue light wavelength range (the wavelength range from 380 nm to 495 nm) is cut off to an excessive degree by the optical film, the optical film interferes with the backlight or the light in the wavelength range emitted from an image display device (for example, light wavelengths above 430 nm emitted from an OLED), which may consequently increase the possible occurrence of problems, such as poor color representation including YI. However, such occurrence of problems can be inhibited if the above-described slope is 2 or more. Because a larger value is preferred as the above-described slope in terms of selectively cutting off light with wavelengths of interest, the upper limit of the above-described slope can be, but is not particularly limited to, for example, 20 or less, or 10 or less.

The above-described slope should be determined as follows. First of all, a piece of 50 mm×50 mm is cut from an optical film and placed into, for example, a spectrophotometer capable of measuring the transmittance at 0.5% of pitch (product name "UV-2450"; manufactured by Shimadzu Corporation) in such a manner that the base material of the optical film faces toward the light source, measuring the transmittance at minimally five points spanning a 1 nm range centered at each wavelength in the wavelength range from 410 nm to 420 nm, and calculating the averages of the values to determine the spectral transmittances in the wavelength range from 410 nm to 420 nm. Then, the slope of the transmittance spectrum in the wavelength range from 410 nm to 420 nm is obtained by applying the least square method to the determined spectral transmittances. The arithmetical mean of three measurements is determined as the above-described slope. Additionally, the conditions for measuring the spectral transmittance are the same as the above-described conditions for measuring the spectral transmittance at wavelengths of 380 nm, 410 nm, and 440 nm.

The optical film 10 preferably has antistatic properties. The presence of antistatic properties in the optical film 10 allows the optical film 10 to be especially suitably used in IPS-type liquid crystal display devices. In cases where the liquid crystal display device refers to an IPS-type liquid crystal display device, the optical film 10 preferably has a surface resistance value of $10^{10}\Omega/\square$ or less, preferably $10^9$ $\Omega/\square$ or less. Particularly, in cases where the liquid crystal display device refers to an IPS-type liquid crystal display device with an in-cell-type touch panel, the optical film 10 preferably has a surface resistance value of $10^7\Omega/\square$ or more and $10^{10}\Omega/\square$ or less. In cases where the liquid crystal display device refers to an IPS-type liquid crystal display device with an in-cell-type touch panel, the lower limit of the surface resistance of the optical film 10 is $10^8\Omega/\square$ or more and the upper limit of the surface resistance is $10^9\Omega/\square$ or less.

The surface resistance should be measured using a resistivity meter (product name "Hiresta-UP MCP-HT450"; manufactured by Mitsubishi Chemical Analytech Co., Ltd.; probe: URS probe (MCP-HTP14)) with applying a voltage of 500 V in an environment at a temperature of 25±4° C. and a humidity of 50±10%.

The above-described antistatic properties can be obtained by adding an antistatic agent to a light-transmitting functional layer 12 as a component of the optical film 10. The above-described antistatic agent is not limited to a particular agent and any conventionally known antistatic agent may be used. For example, cationic antistatic agents, such as quaternary ammonium salts; particles, such as tin-doped indium oxide (ITO) particles and antimony-doped tin oxide (ATO) particles; and electroconductive polymers can be used. In cases where any of the above-described antistatic agents is used, the content of the antistatic agent is preferably 1% by mass or more and 30% by mass or less of the total mass of the total solids.

The optical film 10 is preferably foldable. Specifically, the optical film 10 preferably forms no crack when the optical film 10 is wrapped around a stainless rod with a diameter of 2 mm in such a manner that the light-transmitting functional layer 12 faces outward or inward, in accordance with the mandrel test described in JIS K5600-5-1: 1999. The mandrel test is carried out by cutting the optical film in a size of 100 mm×25 mm and wrapping the resulting piece of film around a stainless rod with a diameter of 2 mm in such a manner that the longer edges of the optical film face to each other, and then unwinding the optical film after 5 seconds of holding time, to confirm whether any crack is formed in the short-side direction in a portion of the optical film which has had contact with the stainless rod.

In cases where an additional film, such as polarizing plate, is provided to one surface of the optical film 10 through an adhesive or adhesion layer, the mandrel test should be carried out after removing the additional film and the adhesive or adhesion layer by the same procedure as described above. Even if such a removal process is performed, the result of the mandrel test is not significantly affected.

The optical film 10 comprises a light-transmitting base material 11 and the light-transmitting functional layer 12 provided on one surface of the light-transmitting base material 11. The "light-transmitting functional layer" in this specification refers to a layer having light-transmitting properties and intended to exert some function over an optical film. Specific examples of the light-transmitting functional layer include spectral transmittance adjustment layer, overcoat layer, antiglare layer, invisible layer, refractive index modification layer, antifouling layer, and combinations thereof. The light-transmitting functional layer may have a single-layer structure or have a multilayer structure consisting of two or more laminated light-transmitting functional layers.

The surface 10A of the optical film 10 corresponds to the surface 12A of the light-transmitting functional layer 12. The "surface of the light-transmitting functional layer" shall refer to the surface of the light-transmitting functional layer which is opposite to the light-transmitting base material side surface.

The arithmetical mean roughness Ra of the surface 10A of the optical film 10 (the surface 12A of the light-transmitting functional layer 12) is preferably less than 10 nm. In cases where the above-described condition of Ra is satisfied, the optical film 10 becomes a clear film with very high transparency. The above-described Ra can be determined by using a surface roughness measuring instrument (product name "SE-3400"; manufactured by Kosaka Laboratory Ltd.) under the following measurement conditions to measure the surface roughness of the optical film cut in a size of 50 mm×50 mm film by the method according to JIS B0601: 1994.

(1) Stylus for a surface roughness detection unit (product name "SE2555N" (2 µm level), manufactured by Kosaka Laboratory Ltd.)
Tip curvature radius: 2 µm; apex angle: 90 degrees; material: diamond
(2) Measurement conditions used with a surface roughness measuring instrument
Reference length (the cutoff value λc for the roughness curve): 0.8 mm
Evaluation length (the reference length (cutoff value λc)×5): 4.0 mm
Stylus traverse speed: 0.5 mm/s
Spare length: (cutoff value λc)×2
Vertical magnification: 20,000×
Horizontal magnification: 10×

The above-described Ra is defined as the arithmetical mean of values measured at randomly selected three positions on the surface 10A of the optical film 10 where no abnormalities (such as large foreign materials and scratches) are found at least by visual inspection. The upper limit of the above-described Ra is more preferably 8 nm or less.

Additionally, the above-described Ra can also be measured using an atomic force microscope (product name "WET-9100"; manufactured by Shimadzu Corporation), Specifically, three positions in which no abnormalities (such as large foreign materials and scratches) are found at least by visual inspection are randomly selected on the surface of the optical film cut in a size of 50 mm×50 mm, and those positions are then cut from the optical film to obtain three 5 mm-square samples. Meanwhile, a plural number of flat and circular metal plates having a diameter of 15 mm and a thickness of 1 mm are prepared and each metal plate is attached with a piece of a double-sided carbon coated tape manufactured by Nissin EM Co., Ltd. Each sample is attached to each piece of the tape in such a manner that the surface of the sample (the surface of the optical film) faces upward. Then, the metal plates with the attached samples are left in a desiccator overnight to secure adhesion between the tape and the samples. After leaving overnight, each metal plate with an attached sample is fixed on the stage of an atomic force microscope (product name "WET-9400"; manufactured by Shimadzu Corporation), by means of a magnet, to observe the surface profiles of square measurement areas of 5 µm side under the atomic force microscope in tapping mode. Then, the Ra is calculated from the observation data using the surface analysis software installed in the atomic force microscope. The vertical scale during the surface analysis is 20 nm. The observation is performed at room temperature, in which a cantilever NCHR-20 manufactured by NanoWorld AG is used as a cantilever. In the observation of surface profile, five positions are randomly selected from each of three samples to observe the surface profile at the 15 positions in total. Then, the Ra is calculated from all the data obtained at the 15 positions using the surface analysis software installed in the atomic force microscope, and the arithmetical mean of the values from the 15 positions is determined as the Ra of the samples.

The applications of the optical film 10 are not generally limited, and the applications of the optical film 10 include, for example, image display devices in smartphones, tablet terminals, personal computers (PCs), wearable terminals, digital signage systems, televisions, automotive navigation systems, and the like. Additionally, the optical film 10 is also suitable for vehicle displays. The optical film 10 is also favorable for applications which require flexible forms, such as foldable or rollable forms, of the above-described image display devices.

The optical film 10 can be cut into a desired size or may be rolled. In cases where the optical film 10 is cut into a desired size, the optical film is not limited to a particular size, and the size of the film is appropriately determined depending on the display size of an image display device. Specifically, the optical film 10 may be, for example, 2.8 inches or more and 500 inches or less in size. The term "inch" as used herein shall refer to the length of a diagonal when the optical film is rectangular, and to the length of a diameter when the optical film is circular, and to the average of major and minor axes when the optical film is elliptical. In this respect, if the optical film is rectangular, the aspect ratio of the optical film is not limited to a particular ratio when the above-described size in inch is determined, as long as no problem is found with the optical film used for the display screen of an image display device. Examples of the aspect ratio include height-to-width ratios of 1:1, 4:3, 16:10, 16:9, and 2:1. However, particularly in optical films used for vehicle displays and digital signage systems which are rich in designs, the aspect ratio is not limited to the above-described aspect ratios. Additionally, in cases where the optical film 10 is large in size, the optical film will be trimmed to the A5 size (148 mm×210 mm) starting at an arbitrary position and then trimmed to fit size requirements of each measurement item.

<<<Light-Transmitting Base Material>>>

The light-transmitting base material 11 is a base material having light-transmitting properties. Examples of the constituent material of the light-transmitting base material include, but are not particularly limited to, light-transmitting resins, such as polyester resin, cellulose acetate resin, cycloolefin polymer resin, polyethersulfone resin, polycarbonate resin, polyamide resin, polyimide resin, polyamide-imide resin, polyolefin resin, (meth)acrylic resin, polyvinyl chloride resin, polyvinylidene chloride resin, polystyrene resin, polyvinyl alcohol resin, polyacrylate resin, and polyphenylene sulfide resin; and mixtures thereof. Among those resins, cellulose acetate resins, cycloolefin polymer resins, polyimide resins, and polyamide resins are preferable; among those resins, cellulose acetate resins, particularly cellulose triacetate resins, are further preferable in terms of, for example, high transparency, and polyimide and polyamide resin are more preferable in terms of flexibility. The light-transmitting base material may also be supplemented as necessary with various additives, such as plasticizer, ultraviolet absorber, and lubricant.

Examples of the polyester resin include resins and the like which contain at least one of polyethylene terephthalate (PET), polypropylene terephthalate (PEN), polybutylene terephthalate, and polyethylene naphthalate as a component. It is understood that in cases where a polyester resin is used, the polyester resin is excited upon exposure to ultraviolet light to emit fluorescent light. Although such fluorescent light may affect the color of display screens, the optical film 10 shields most light in the wavelength range below 380 nm as described above and thus can appropriately prevent generation of fluorescent light, even if a polyester resin is used in the light-transmitting base material 11.

Examples of the cellulose acetate resin include cellulose triacetate and cellulose diacetate resins. The cellulose triacetate resin is a resin capable of having an average light transmittance of 50% or more in the visible light range from 380 to 780 nm. The cellulose triacetate resin preferably has an average light transmittance of 70% or more, further preferably 85% or more.

The cellulose triacetate resin may include resins of esters composed of cellulose and acetic acid in combination with another fatty acid, such as cellulose acetate propionate and cellulose acetate butyrate, as well as pure cellulose triacetate. Additionally, these cellulose triacetates may include other lower cellulose fatty acid esters, such as cellulose diacetate, as necessary.

Examples of the cycloolefin polymer resin include polymers of norbornene-based monomers and polymers of monocyclic cycloolefin monomers. Commercially available cycloolefin polymer-based base materials include, for example, ZEONEX and ZEONOR (norbornene-based resins) manufactured by ZEON Corporation, SUMILITE FS-1700 manufactured by Sumitomo Bakelite Co., Ltd., ARTON (modified norbornene-based resin) manufactured by JSR Corporation, APEL (cyclic olefin copolymer) manufactured by Mitsui Chemicals Inc., Topas (cyclic olefin copolymer) manufactured by Ticona, and OPTREZ OZ-1000 series (alicyclic acrylic resin) manufactured by Hitachi Chemical Co., Ltd.

Examples of the polycarbonate resin include aromatic polycarbonates based on bisphenols (such as bisphenol A), and aliphatic polycarbonates such as diethylene glycol bis (allyl carbonate).

Examples of the (meth)acrylic resin include poly(methyl (meth)acrylate), poly(ethyl (meth)acrylate), and methyl (meth)acrylate-butyl (meth)acrylate copolymer.

Examples of the polyimide resin include compounds having any of the structures represented by the formulae below. In the formulae below, n represents the number of repeating units, which is an integer of 2 or more.

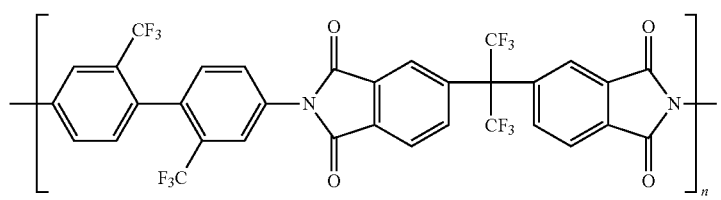

(1)

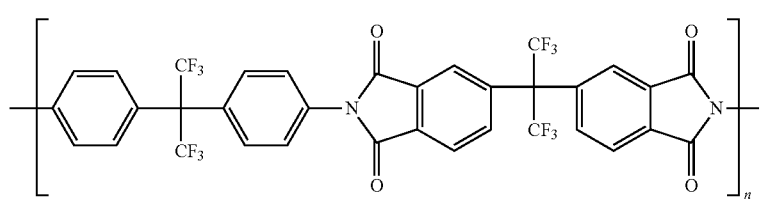

(2)

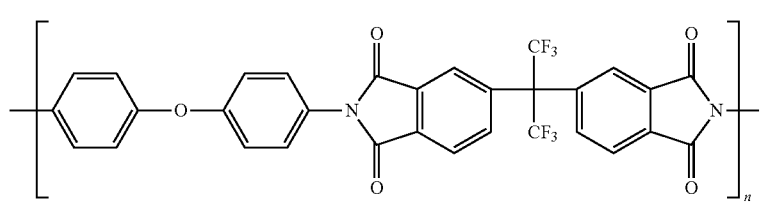

(3)

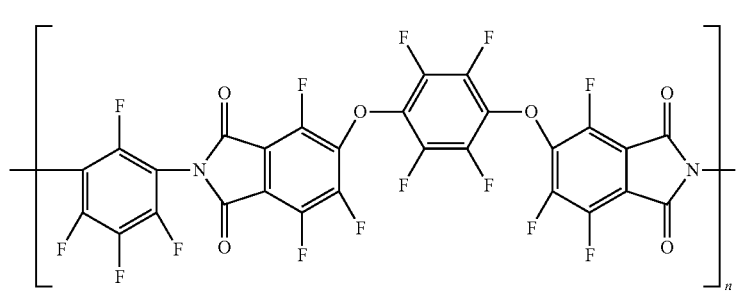

(4)

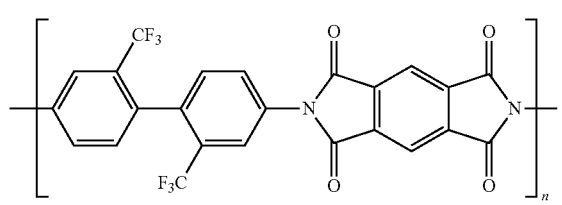

(5)

-continued
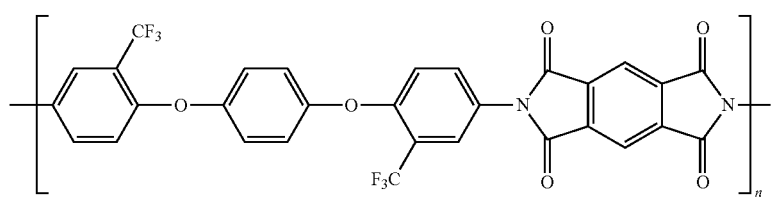
(6)
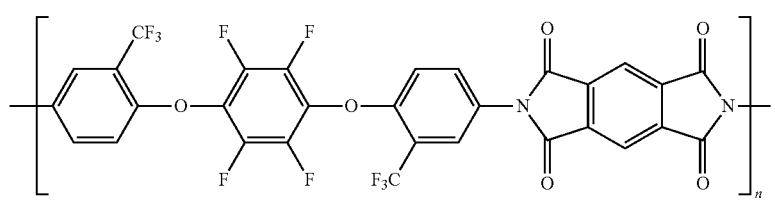
(7)
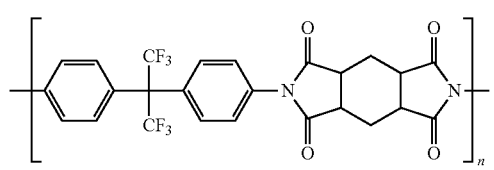
(8)
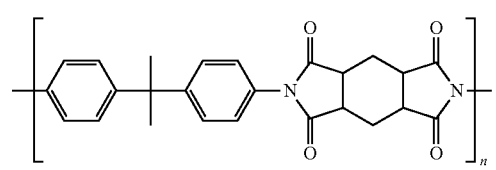
(9)
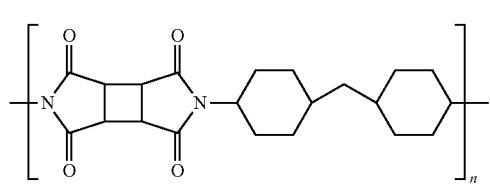
(10)
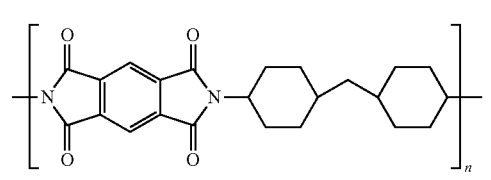
(11)
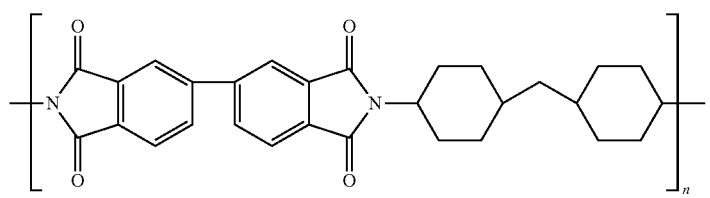
(12)
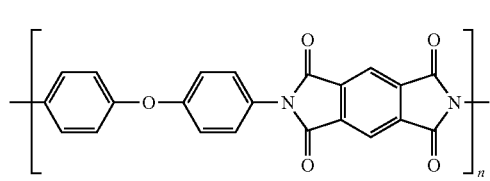
(13)
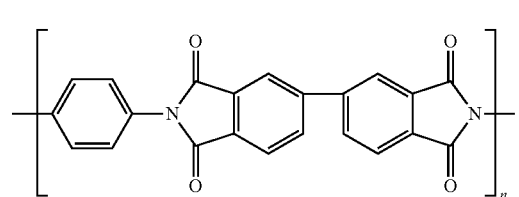
(14)
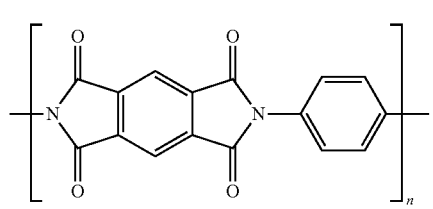
(15)
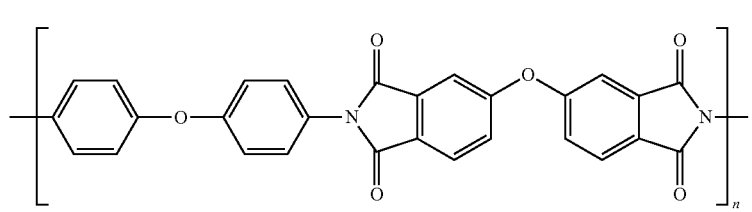
(16)

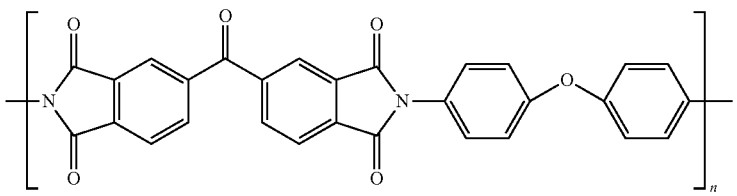
(17)

The concept of polyamide resin includes aromatic polyamides (aramids) as well as aliphatic polyamides. The polyamide resin generally refers to a resin having the backbone represented by the formula (18) or (19) below, and examples of the above-described polyamide resin include a compound represented by the formula (20) below. In the formulae below, n represents the number of repeating units, which is an integer of 2 or more.

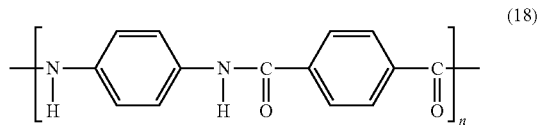
(18)

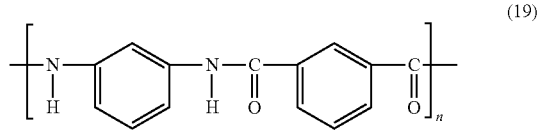
(19)

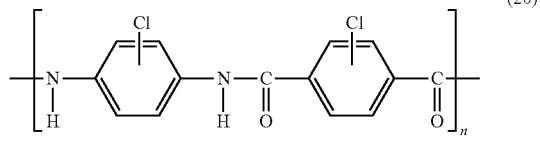
(20)

A commercially available base material may be used as a base material composed of the polyimide or polyamide resin represented by any of the above-described formulae (1) to (17) and (20). Commercially available base materials composed of any of the above polyimide resins include, for example, Neoplim manufactured by Mitsubishi Gas Chemical Company, Inc. and the like, while commercially available base materials composed of any of the above polyamide resins include, for example, Mictron manufactured by Toray Industries, Inc. and the like.

The thickness of the light-transmitting base material 11 is not limited to a particular value but is preferably 250 μm or less. In cases where the thickness of the light-transmitting base material 11 is 250 μm or less, the base material can ensure flexibility for the optical film and make the optical film thinner. The lower limit of a thickness of the light-transmitting base material 11 preferably is 10 μm or more in terms of improving the mechanical strength of the optical film 10. The upper limit of a thickness of the light-transmitting base material 11 more preferably is 125 μm or less, further preferably 115 μm or less, most preferably 100 μm or less. The thickness of the light-transmitting base material can be determined by imaging a cross-section of the light-transmitting base material using a scanning electron microscope (SEM), measuring the thickness of the light-transmitting base material at 20 different locations within the resulting cross-sectional image, and calculating the arithmetical mean of the thickness values at the 20 locations. The image should be acquired with a scanning electron microscope at a magnification suitable for the thickness of the light-transmitting base material, at which the interfacial boundary between the light-transmitting base material and the light-transmitting functional layer is clarified. Specifically, the magnification is set appropriately depending on the thickness of the light-transmitting base material, as the magnification is set, for example, to 1,000 times for 50 μm of thickness and to 500 times for 100 μm of thickness in the light-transmitting base material.

The surface of the light-transmitting base material 11 may be etched or undercoated beforehand by sputtering, corona discharge treatment, ultraviolet exposure, electron beam exposure, chemical conversion, oxidation, or the like. Such pretreatment can improve the adhesion with, for example, a light-transmitting functional layer formed on the above-described light-transmitting base material. Additionally, the surface of the light-transmitting base material may be cleaned or cleansed as necessary by solvent cleaning, ultrasonic cleaning, or the like before a light-transmitting functional layer and the like are formed.

<<<Light-Transmitting Functional Layer>>>

The light-transmitting functional layer 12 comprises a spectral transmittance adjustment layer 13 and an overcoat layer 14 provided on an opposite side to the light-transmitting base material 11 side in the spectral transmittance adjustment layer. The light-transmitting functional layer 12 shown in FIG. 1 is composed of a spectral transmittance adjustment layer 13 and an overcoat layer 14, but a light-transmitting functional layer may be composed of only a spectral transmittance adjustment layer 13.

The light-transmitting functional layer 12 has a film thickness of 9 μm or less. In cases where the light-transmitting functional layer has a film thickness of more than 9 μm, the light-transmitting functional layer may be broken due to the strain induced by stress. Because the interfacial boundary between the light-transmitting base material and the light-transmitting functional layer can be visually observed based on the difference in contrast between the base material and the functional layer observed in microscopic image, the "film thickness of the light-transmitting functional layer" refers to the distance from the interfacial boundary to the surface of the light-transmitting functional layer. In cases where the light-transmitting functional layer has a single-layer structure, the interfacial boundary between the light-transmitting base material and the light-transmitting functional layer can be visually observed based on the difference in contrast between the base material and the functional layer observed in microscopic image, so that the film thickness can be clearly determined. On the other hand, in cases where the light-transmitting functional layer has a multilayer structure, it may not be possible to clearly identify interfacial boundaries between sublayers of the light-transmitting functional layer. In this respect, if a light-transmitting functional layer has a multilayer structure, the "film thickness of the light-transmitting functional layer" refers to the sum of the film thicknesses of all the sublayers of the light-transmitting functional layer. Thus, even if a light-transmitting functional layer has a multilayer structure and interfacial boundaries between sublayers of the light-transmitting functional layer are not clearly identified, the total film thickness of the light-transmitting functional layer can be determined. With respect to the maintenance of uniformity in the film thickness of a light-transmitting functional layer, the lower limit of the film thickness of the light-transmitting functional layer 12 preferably is 0.5 µm or more, 1 µm or more, 1.5 µm or more, 2 µm or more, 2.5 µm or more, or 3 µm or more, and the upper limit of the film thickness of the light-transmitting functional layer 12 more preferably is 8 µm or less, 7 µm or less, or 6 µm or less (in descending order of preference). The film thickness of the light-transmitting functional layer can be determined by imaging a cross-section of the light-transmitting functional layer using a scanning electron microscope (SEM), measuring the film thickness of the light-transmitting functional layer at 20 different locations within the resulting cross-sectional image, and calculating the arithmetical mean of the film thickness values at the 20 different locations.

Specifically, the method of acquiring cross-sectional images should be as follows. First of all, an optical film cut in a size of 1 mm×10 mm is embedded in an embedding resin to prepare a block, and homogeneous sections having a thickness of around 70 nm to 300 nm and having no openings or the like are sliced from the block according to a commonly used sectioning technique. For the preparation of sections, an "Ultramicrotome EM UC7" (Leica Microsystems GmbH) or the like is used. Then, the block remaining after slicing the homogeneous sections with no openings or the like is used as a measurement sample. Then, cross-sectional images of the measurement sample are acquired using a scanning electron microscope (SEM) (product name "S-4800"; manufactured by Hitachi High-Technologies Corporation). The cross-sectional images were acquired using the above-described S-4800 by setting the detector to "SE," the accelerating voltage to "3 kV," and the emission current to "10 µA." The focus, contrast, and brightness are appropriately adjusted at a magnification of 100 to 100,000 times, preferably at a magnification of 1,000 to 10,000 times depending on the film thickness of a light-transmitting functional layer, so that each layer can be identified by observation. To reduce any variation in measured film thicknesses, the film thickness of the light-transmitting functional layer is recommended to be measured by observation at a magnification as low as possible. For example, magnifications of 2,000 times and 2,000 to 5,000 times are preferable for film thicknesses of around 9 µm and around 5 µm in the light-transmitting functional layer, respectively. Furthermore, the beam monitor aperture is set to "1", the objective lens aperture is set "2", and the WD is set to "8 mm".

<<Spectral Transmittance Adjustment Layer>>

The spectral transmittance adjustment layer 13 is a layer containing a resin and a spectral transmittance modifier. The spectral transmittance adjustment layer 13 may contain inorganic particles, a leveling agent, and a polymerization initiator, such as a radical polymerization initiator or a cationic polymerization initiator, or any residue thereof, in addition to the resin and the spectral transmittance modifier.

The spectral transmittance adjustment layer 13 preferably has a film thickness of 9 µm or less. In cases where the spectral transmittance adjustment layer has a film thickness of more than 9 µm, the spectral transmittance adjustment layer may be broken due to the strain induced by stress. The film thickness of the spectral transmittance adjustment layer 13 can be determined by the same method as for the film thickness of the light-transmitting functional layer 12. The lower limit of the film thickness of the spectral transmittance adjustment layer 13 more preferably is 0.5 µm or more, 1 µm or more, 1.5 µm or more, 2 µm or more, 2.5 µm or more, or 3 µm or more, and the upper limit of the film thickness of the spectral transmittance adjustment layer 13 more preferably is 8 µm or less, 7 µm or less, 6 µm or less, or 5 µm or less (in descending order of preference).

The hardness of the spectral transmittance adjustment layer 13 measured by the nanoindentation technique (indentation hardness) is preferably 120 MPa or more. When the indentation hardness of the spectral transmittance adjustment layer 13 is 120 MPa or more, variation in the thickness of the layer can be reduced, as well as generation of damages due to friction during the handling of the optical film can be inhibited. In this specification, the "indentation hardness" refers to a hardness measured when an indenter is pressed with a maximum indentation load of 300 µN in a nanoindentation hardness test. The minimum indentation hardness of the spectral transmittance adjustment layer 13 is preferably 200 MPa or more. The upper limit of the indentation hardness of the spectral transmittance adjustment layer 13 is preferably 400 MPa or less, or 300 MPa or less (in descending order of preference) in terms of flexibility. Because the hardness of a soft layer cannot be measured by the nanoindentation technique, it may not be possible to measure the indentation hardness of an adhesive layer.

Measurement of the indentation hardness will be performed using a "TI950 TriboIndenter" manufactured by Hysitron, Inc. Specifically, an optical film cut in a size of 1 mm×10 mm is first embedded in an embedding resin to prepare a block, from which measurement samples suitable for the hardness test by the nanoindentation technique are prepared. For the preparation of measurement samples, a "Ultramicrotome EM UC7" (Leica Microsystems GmbH) or the like can be used. In cases where the light-transmitting functional layer has a multilayer structure as shown in FIG. 1, it is confirmed whether or not the interfacial boundary between the spectral transmittance adjustment layer and the overcoat layer is clearly detected, for example, by observing a cross-section of such a measurement sample under a scanning electron microscope (SEM). In cases where the light-transmitting functional layer has a single-layer structure, such SEM observation can be omitted. Then, the measurement sample is fixed on the stage of a TI950 TriboIndenter manufactured by Hysitron, Inc., in such a manner that a surface of the measurement sample to which an indenter is to be pressed is arranged parallel to the top surface of the stage. A Berkovich indenter is pressed at a rate of 10 nm/s with a maximum indentation load of 300 µN according to the load control procedure into a measurement position within a central planar portion of the spectral transmittance adjustment layer in cases where the interfacial boundary between the spectral transmittance adjustment layer and the overcoat layer is clearly detected by SEM observation, or a measurement position within a central planar portion of the light-transmitting functional layer in cases where the interfacial boundary between the spectral transmittance adjustment layer and the overcoat layer is not clearly detected, held with the maximum load for five seconds, and then unloaded at the same rate. Then, the indentation depth h (nm) corresponding to this indentation load F (µN) is continuously measured to prepare a load-displacement curve, and the hardness can be determined as a value calculated by dividing the maximum indentation load $F_{max}$ (N) by the projected area $A_p$ (mm$^2$) of contact of the indenter with the spectral transmittance adjustment layer, which is computed from the prepared load-displacement curve. The above-described $A_p$ is defined as a projected area of contact obtained by applying a correction to the indenter tip radius according to the standard method of the instrument. The arithmetical mean of the measurements at 10 different positions is determined as the indentation hardness.

<Resins>

The resin contained in the spectral transmittance adjustment layer 13 includes a polymer of an ionizing radiation-polymerizable compound. The resin may include an air-dry curable resin or a thermosetting compound, in addition to the polymer of an ionizing radiation-polymerizable compound.

(Ionizing Radiation-Polymerizable Compounds)

The ionizing radiation-polymerizable compound refers to a molecule having at least one ionizing radiation-polymerizable functional group. The "ionizing radiation-polymerizable functional group" in this specification refers to a functional group which can undergo ionizing radiation-induced polymerization. Examples of the ionizing radiation-polymerizable functional group include ethylenic unsaturated groups such as (meth)acryloyl group, vinyl group, and allyl group. Both "acryloyl group" and "methacryloyl group" are meant by the word "(meth)acryloyl group" in this specification. In addition, the types of ionizing radiation applied to induce polymerization of the ionizing radiation-polymerizable compound include visible light, ultraviolet light, X ray, electron beam, α ray, β ray, and γ ray.

Examples of an ionizing radiation-polymerizable compound having one ethylenic unsaturated group can include ethyl (meth)acrylate, ethylhexyl (meth)acrylate, styrene, methylstyrene, and N-vinylpyrrolidone. Examples of an ionizing radiation-polymerizable compound having two or more ethylenic unsaturated groups can include polyfunctional compounds, such as polymethylol propane tri(meth)acrylate, hexanediol (meth)acrylate, tripropylene glycol di(meth)acrylate, diethylene glycol di(meth)acrylate, pentaerythritol tri(meth)acrylate, dipentaerythritol hexa(meth)acrylate, 1,6-hexanediol di(meth)acrylate, and neopentyl glycol di(meth)acrylate; reaction products between the above-described polyfunctional compounds and (meth)acrylates or the like (for example, poly(meth)acrylate esters of polyhydric alcohols).

In addition to the above-described compounds, for example, relatively low-molecular-weight polyester, polyether, acrylic, epoxy, urethane, alkyd, spiroacetal, polybutadiene, and polythiol-polyene resins which have an ethylenic unsaturated group(s) can also be used as the above-described ionizing radiation-polymerizable compound.

As the ionizing radiation-polymerizable compound, an ionizing radiation-polymerizable monomer, an ionizing radiation-polymerizable oligomer, and/or an ionizing radiation-polymerizable prepolymer can be prepared and used as appropriate. As the ionizing radiation-polymerizable compound, at least an ionizing radiation-polymerizable prepolymer is preferably used in terms of achieving an optical film with excellent foldability. Examples of the ionizing radiation-polymerizable prepolymer include acrylic resins.

(Air-Dry Curable Resins)

The air-dry curable resin refers to a resin, such as a thermoplastic resin, which forms a coating film just by evaporation of an added solvent for adjustment of the content of solids in a coating process. Combinational use of an air-dry curable resin allows effective prevention of coating failure on a coating surface. The air-dry curable resin which can be used in combination with the above-described ionizing radiation-polymerizable compound is not limited to a particular resin, and thermoplastic resins can generally be used as the air-dry curable resin.

Examples of the above-described thermoplastic resin include, but are not particularly limited to, styrene resins, (meth)acrylic resins, vinyl acetate resins, vinyl ether resins, halogen-containing resins, alicyclic olefin resins, polycarbonate resins, polyester resins, polyamide resins, cellulose derivatives, silicone resins, and rubber or elastomers.

The above-described thermoplastic resin is preferably amorphous and soluble in organic solvents (particularly, common solvents that can dissolve plural polymers and polymerizable compounds). In particular, styrene resins, (meth)acrylic resins, alicyclic olefin resins, polyester resins, cellulose derivatives (such as cellulose esters) and the like are preferred in terms of film-forming property, transparency, and weather resistance.

(Thermosetting Compounds)

Examples of the thermosetting compound include, but are not particularly limited to, phenol resin, urea resin, diallylphthalate resins, melamine resins, guanamine resins, unsaturated polyester resins, polyurethane resins, epoxy resins, aminoalkyd resins, melamine-urea condensate resins, silicon resins, and polysiloxane resins.

<Spectral Transmittance Modifier>

The spectral transmittance modifier is an agent for modifying the spectral transmittance of the optical film 10. The aforementioned spectral transmittance can be suitably satisfied in cases where the spectral transmittance adjustment layer 13 contains, for example, an ultraviolet absorber, such as sesamol-type benzotriazole monomers represented by the general formula (21) below, 2-[2-hydroxy-3,5-bis(α,α-dimethylbenzyl)phenyl]-2H-benzotriazole (product name "Tinuvin 234"; manufactured by BASF SE), or 2-(5-chloro-2-benzotriazolyl) butyl-p-cresol (product name "Tinuvin 326"; manufactured by BASF SE), or a colorant such as dye or pigment. Among those compounds, sesamol-type benzotriazole monomers represented by the general formula (21) below are preferable because the ability to shield blue light in a more selective manner with the aid of the above-describe increased slope in the spectrum can result in achievement of both blue light shielding and reduction in increase of YI value. In addition to the benzotriazole-type ultraviolet absorbers, ultraviolet absorbers, for example, of benzophenone-type or triazine-type may also be used as the ultraviolet absorber. As the colorant, for example, indole-based materials, such as BONASORB UA-3911 and UA-3912 manufactured by Orient Chemical Industries Co., Ltd.; azomethine-based materials, such as BONASORB UA-3701 manufactured by Orient Chemical Industries Co., Ltd.; Lumogen F Violet 570 and Tinuvin CarboProtect manufactured by BASF SE; and the like can also be used.

(21)

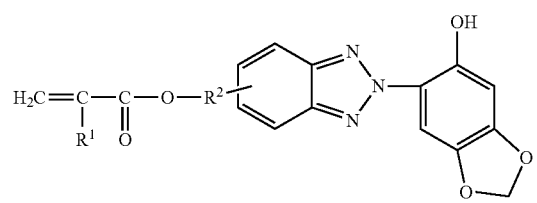

In the formula, $R^1$ represents a hydrogen atom or methyl group, and $R^2$ represents a linear or branched alkylene or oxyalkylene group having 1 to 6 carbon atoms.

The above-described sesamol-type benzotriazole monomer is not limited to a particular sesamol-type benzotriazole monomer. Specific examples of the substance can include 2-[2-(6-hydroxybenzo[1,3]dioxol-5-yl)-2H-benzotriazol-5-yl]ethylmethacrylate, 2-[2-(6-hydroxybenzo[1,3]dioxol-5-yl)-2H-benzotriazol-5-yl]ethylacrylate, 3-[2-(6-hydroxybenzo[1,3]dioxol-5-yl)-2H-benzotriazol-5-yl] propylmethacrylate, 3-[2-(6-hydroxybenzo[1,3]dioxol-5-yl)-2H-benzotriazol-5-yl]propylacrylate, 4-[2-(6-hydroxybenzo[1,3]dioxol-5-yl)-2H-benzotriazol-5-yl] butylmethacrylate, 4-[2-(6-hydroxybenzo[1,3]dioxol-5-yl)-2H-benzotriazol-5-yl]butylacrylate, 2-[2-(6-hydroxybenzo[1,3]dioxol-5-yl)-2H-benzotriazol-5-yloxy] ethylmethacrylate, 2-[2-(6-hydroxybenzo[1,3]dioxol-5-yl)-2H-benzotriazol-5-yloxy]ethylacrylate, 2-[3-{2-(6-hydroxybenzo[1,3]dioxol-5-yl)-2H-benzotriazol-5-yl}propanoyloxy]ethylmethacrylate, 2-[3-{2-(6-hydroxybenzo[1,3]dioxol-5-yl)-2H-benzotriazol-5-yl}propanoyloxy]ethylacrylate, 4-[3-{2-(6-hydroxybenzo[1,3]dioxol-5-yl)-2H-benzotriazol-5-yl}propanoyloxy] butylmethacrylate, 4-[3-{2-(6-hydroxybenzo[1,3]dioxol-5-yl)-2H-benzotriazol-5-yl}propanoyloxy]butylacrylate, 2-[3-{2-(6-hydroxybenzo[1,3]dioxol-5-yl)-2H-benzotriazol-5-yl}propanoyloxy]ethylmethacrylate, 2-[3-{2-(6-hydroxybenzo[1,3]dioxol-5-yl)-2H-benzotriazol-5-yl}propanoyloxy]ethylacrylate, 2-(methacryloyloxy)ethyl 2-(6-hydroxybenzo[1,3]dioxol-5-yl)-2H-benzotriazole-5-carboxylate, 2-(acryloyloxy)ethyl 2-(6-hydroxybenzo[1,3]dioxol-5-yl)-2H-benzotriazole-5-carboxylate, 4-(methacryloyloxy)butyl 2-(6-hydroxybenzo[1,3]dioxol-5-yl)-2H-benzotriazole-5-carboxylate, and 4-(acryloyloxy)butyl 2-(6-hydroxybenzo[1,3]dioxol-5-yl)-2H-benzotriazole-5-carboxylate. Additionally, these sesamol-type benzotriazole monomers may be used individually or in combination of two or more.

Whether or not a spectral transmittance modifier is present in the light-transmitting functional layer can be determined by, for example, an analytical technique, such as infrared spectroscopy, Raman spectroscopy, pyrolysis-gas chromatography-mass spectrometry, liquid chromatography-mass spectrometry, X-ray photoelectron spectroscopy, or TOF-SIMS.

Any of the above-described spectral transmittance modifiers may be contained in the spectral transmittance adjustment layer 13, in any fashion whatever, as long as it has an aspect to satisfy the aforementioned requirements of spectral transmittance. Specifically, the aforementioned requirements of spectral transmittance may be satisfied by, for example, adding any of the above-described spectral transmittance modifiers to one light-transmitting functional layer, or allowing plural layers to share a function to satisfy the above-described requirements of spectral transmittance.

Examples of the configuration in which plural layers share a function to satisfy the above-described requirements of spectral transmittance include a configuration in which a spectral transmittance adjustment layer is composed of two layers, namely a first spectral transmittance adjustment layer that contains a spectral transmittance modifier as described above to achieve only the spectral transmittance at a wavelength of 380 nm and a second spectral transmittance adjustment layer that contains another spectral transmittance modifier as described above to achieve the requirements of spectral transmittance at wavelengths of 410 nm and 440 nm. Furthermore, in cases where the above-described spectral transmittance adjustment layer is composed of three or more layers, any of the above-described spectral transmittance modifiers may be contained in each spectral transmittance adjustment layer to satisfy the aforementioned requirements of spectral transmittance.

Any of the above-described spectral transmittance modifiers may be contained at a concentration of 0.05% by mass or more and 50% by mass or less in, for example, the spectral transmittance adjustment layer 13. Once contained at a concentration within the above-described range, the spectral transmittance modifier can function to satisfy the aforementioned spectral transmittance profile.

Any of the above-described spectral transmittance modifiers may react with a constituent resin of the spectral transmittance adjustment layer 13 to be integrally incorporated in the spectral transmittance adjustment layer 13, or may be contained individually without reacting with a constituent resin of the spectral transmittance adjustment layer 13.

Specific examples of the spectral transmittance adjustment layer 13 in which a spectral transmittance modifier reacts with a constituent resin of the spectral transmittance adjustment layer 13 to be integrally incorporated include a spectral transmittance adjustment layer formed using a light-transmitting functional layer composition containing 90 parts by mass of an acrylic or acrylate polymer bound with A, B, and C, and 10 parts by mass of PETA, where "A" represents a sesamol-type benzotriazole monomer as the above-described spectral transmittance modifier, "B" represents methyl methacrylate (MMA), and C represents other agents such as ultraviolet absorber (for example, "RUVA93" manufactured by Otsuka Chemical Co., Ltd., "SEESORB R18" manufactured by Shipro Kasei Kaisha, Ltd., and the like), and X ranges from 10 to 55 parts by mass when the content X of A in the polymer is expressed in parts by mass. The optical film 10 containing the thus-obtained spectral transmittance adjustment layer 13 can satisfy the aforementioned spectral transmittance profile and consequently has excellent blue light shielding properties.

The spectral transmittance adjustment layer 13 can be formed, for example, by applying a spectral transmittance adjustment layer composition containing an ionizing radiation-polymerizable compound and a spectral transmittance modifier to one surface 11A of the light-transmitting base material 11, drying the applied composition, and curing the dried composition by exposure to ionizing radiation.

<Spectral Transmittance Adjustment Layer Composition>

The spectral transmittance adjustment layer composition may contain, in addition to an ionizing radiation-polymerizable compound and a spectral transmittance modifier, an air-dry curable resin, a thermosetting compound, a polymerization initiator, a solvent, and the like.

(Polymerization Initiators)

Any known polymerization initiator can be used without any particular limitation, and specific examples of the polymerization initiator include acetophenones, benzophenones, Michler's benzoyl benzoate, α-amyloxime esters, thioxantones, propyophenones, benzyls, benzoins, and acylphosphine oxides. Additionally, a photosensitizer is preferably mixed for use, and specific examples of the photosensitizer include n-butylamine, triethylamine, and poly-n-butylphosphine.

In cases where the above-described ionizing radiation-polymerizable compound contains a radical polymerizable functional group(s), radical polymerization initiators, such as acetophenones, benzophenones, thioxantones, benzoin, and benzoin methyl ether, are preferably used individually or in combination as the polymerization initiator. Among radical polymerization initiators, for example, 2,4,6-trimethylbenzoyl-diphenyl phosphine oxide (for example, Omnirad TPO manufactured by IGM Resins B.V.), bis(2,4,6-trimethylbenzoyl)phenyl phosphine oxide (for example, Omnirad 819 manufactured by IGM Resins B.V.), 1-hydroxycyclohexyl phenyl ketone (for example, Omnirad 184 manufactured by IGM Resins B.V.), and mixtures thereof are more preferable in terms of inhibiting curing retardation caused by ultraviolet absorbing properties.

Additionally, in cases where the above-described ionizing radiation-polymerizable compound contains a cationic polymerizable functional group(s), cationic polymerization initiators, such as aromatic diazonium salts, aromatic sulfonium salts, aromatic iodonium salts, metallocene compounds, and benzoin sulfonate, are preferably used individually or in combination as the polymerization initiator. Among cationic polymerization initiators, aromatic sulfonium salts or the like are more preferable in terms of excellent curing properties.

The content of the above-described polymerization initiator in the spectral transmittance adjustment layer composition is preferably 1 part by mass or more and 10 parts by mass or less relative to 100 parts by mass of the above-described ionizing radiation-curable resin. In cases where the content is less than 1 part by mass, the hardness of the spectral transmittance adjustment layer may be insufficient; in cases where the content is more than 10 parts by mass, ionizing radiation does not reach deep enough into the coating film to promote internal curing, which may cause a resulting optical film not to have a surface hardness of interest (for example, a pencil hardness of B or harder as described below).

The above-described photopolymerization initiator more preferably has a minimum content of 2 parts by mass or more and a maximum content of 8 parts by mass or less. By limiting the content of the above-described photopolymerization initiator to a value within this range, no uneven distribution of hardness in the film thickness direction is generated, which promotes even distribution of hardness.

(Solvents)

A solvent can be selected and used depending on the type and solubility of the used ionizing radiation-polymerizable compound, and examples of the solvent can include ketones (such as acetone, methyl ethyl ketone, methyl isobutyl ketone, cyclohexanone, and diacetone alcohol), ethers (such as dioxane, tetrahydrofuran, propylene glycol monomethyl ether, and propylene glycol monomethyl ether acetate), aliphatic hydrocarbons (such as hexane), alicyclic hydrocarbons (such as cyclohexane), aromatic hydrocarbons (such as toluene and xylene), halocarbons (such as dichloro methane and dichloro ethane), esters (such as methyl acetate, ethyl acetate, and butyl acetate), water, alcohols (such as ethanol, isopropanol, butanol, and cyclohexanol), cellosolves (such as methyl cellosolve and ethyl cellosolve), cellosolve acetates, sulfoxides (such as dimethyl sulfoxide), amides (such as dimethylformamide and dimethylacetamide), and may be mixture solvents thereof.

The content of raw materials (solids) in the spectral transmittance adjustment layer composition is not limited to a particular value, and the content is preferably 5% by mass or more and 70% by mass or less, more preferably 15% by mass or more and 60% by mass or less.

The spectral transmittance adjustment layer composition may be supplemented with, for example, any conventionally known dispersing agent, surfactant, an antistatic agent, silane coupling agent, thickener, coloring inhibitor, colorant (pigment and dye), antifoam agent, leveling agent, flame retardant, ultraviolet absorber, adhesion promoter, polymerization inhibitor, antioxidant, surface modifier, and/or lubricant for the purpose of, for example, increasing the hardness, reducing cure shrinkage, controlling the refractive index, and/or providing antiglare properties.

The spectral transmittance adjustment layer composition may be used in the form of a mixture with a photosensitizer, and specific examples of the photosensitizer include n-butylamine, triethylamine, and poly-n-butylphosphine.

The spectral transmittance adjustment layer composition can be prepared using any known apparatus, such as paint shaker, bead mill, kneader, or mixer, by any method without particular limitation, as long as a homogeneous mixture of all components can be prepared by the method.

Examples of the method of applying the spectral transmittance adjustment layer composition to the light-transmitting base material 11 include, but are not particularly limited to, known coating methods, such as spin coating method, dipping method, spraying method, die coating method, bar coating method, roll coating method, meniscus coating method, flexography, screen printing method, and bead coating method.

An ionizing radiation source having an emission peak mainly in the wavelength range from 190 to 450 nm is preferred as the ionizing radiation source used for curing the spectral transmittance adjustment layer composition. Examples of the ionizing radiation source include light sources, such as super high pressure mercury lamp, high pressure mercury lamp, low pressure mercury lamp, carbon arc lamp, blacklight fluorescent lamp, and metal halide lamp.

<<Overcoat Layer>>

The overcoat layer 14 is a layer having a function for providing hard coat properties to the surface 10A of the optical film 10. The term "hard coat properties" refers to properties that result in a hardness of "B" or harder in the pencil hardness test. The pencil hardness test should be carried out by using a pencil hardness tester (product name "Scratch Hardness Tester by Pencil Test (electric-powered)"; manufactured by Toyo Seiki Seisaku-sho, Ltd.) for the optical film cut in a size of 50 mm×100 mm, where a pencil (product name "UNI"; manufactured by Mitsubishi Pencil Co., Ltd.) is moved across the surface of the overcoat layer of the optical film at a moving speed of 1 mm/s by applying a load of 2.94 N. The grade of the hardest pencil that does not scratch the surface of the overcoat layer of the optical film during the pencil hardness test is determined as the pencil hardness of the optical film. A plural number of pencils with different hardness are used for the measurement of pencil hardness and the pencil hardness test is repeated five times on each pencil. In cases where no scratch is made on the surface of the overcoat layer with a pencil with specific hardness in four or more out of the five replicates, the pencil with the hardness is determined to make no scratch on the surface of the overcoat layer. The above-described scratch refers to a scratch which is visibly detectable when the surface of an overcoat layer subjected to the pencil hardness test is observed under transmitting fluorescent light.

The overcoat layer 14 preferably has a film thickness of 1 μm or more and less than 9 μm. In cases where the overcoat layer has a film thickness of less than 1 μm, a desired level of hardness may not be achieved; additionally, in cases where the overcoat layer has a film thickness of 9 μm or more, the overcoat layer may be broken due to the strain induced by stress. The film thickness of the overcoat layer 14 can be determined by the same method as for the spectral transmittance adjustment layer 13.

The overcoat layer 14 can be composed of a resin. The resin contained in the overcoat layer 14 includes a polymer of an ionizing radiation-polymerizable compound. The resin may include an air-dry curable resin or a thermosetting compound, in addition to the polymer of an ionizing radiation-polymerizable compound.

The ionizing radiation-polymerizable compound as a component of the overcoat layer 14 includes an ionizing radiation-polymerizable monomer, an ionizing radiation-polymerizable oligomer, or an ionizing radiation-polymerizable prepolymer, and these compounds can be prepared and used as appropriate. A combination of a ionizing radiation-polymerizable monomer and a ionizing radiation-polymerizable oligomer or prepolymer is preferred as the ionizing radiation-polymerizable compound.

Examples of the ionizing radiation-polymerizable monomer include monomers containing a hydroxyl group(s), such as 2-hydroxyethyl (meth)acrylate, 2-hydroxypropyl (meth)acrylate, and 2-ethylhexyl (meth)acrylate; and (meth)acrylate esters, such as ethylene glycol di(meth)acrylate, diethylene glycol di(meth)acrylate, triethylene glycol di(meth)acrylate, tetraethylene glycol di(meth)acrylate, tetramethylene glycol di(meth)acrylate, trimethylolpropane tri(meth)acrylate, trimethylolethane tri(meth)acrylate, pentaerythritol di(meth)acrylate, pentaerythritol tri(meth)acrylate, pentaerythritol tetra(meth)acrylate, dipentaerythritol tetra(meth)acrylate, dipentaerythritol hexa(meth)acrylate, and glycerol (meth)acrylate.

Preferably, the ionizing radiation-polymerizable oligomer is a polyfunctional oligomer having two or more functional groups, preferably having three or more ionizing radiation-polymerizable functional groups (trifunctional polyfunctional oligomer). Examples of the above-described polyfunctional oligomer include polyester (meth)acrylate, urethane (meth)acrylate, polyester-urethane (meth)acrylate, polyether (meth)acrylate, polyol (meth)acrylate, melamine (meth)acrylate, isocyanurate (meth)acrylate, and epoxy (meth)acrylate.

The ionizing radiation-polymerizable prepolymer has a weight average molecular weight of more than 10,000, preferably a weight average molecular weight of 10,000 or more and 80,000 or less, more preferably 10,000 or more and 40,000 or less. In cases where the ionizing radiation-polymerizable prepolymer has a weight average molecular weight of more than 80,000, the suitability as a coating material is reduced due to the high viscosity of the prepolymer, which may deteriorate the appearance of a resulting light-transmitting resin. Examples of the polyfunctional prepolymer include urethane (meth)acrylate, isocyanurate (meth)acrylate, polyester-urethane (meth)acrylate, and epoxy (meth)acrylate.

The overcoat layer 14 can be formed, for example, by applying an overcoat layer composition containing an ionizing radiation-polymerizable compound to the spectral transmittance adjustment layer, drying the applied composition, and curing the dried composition by exposure to ionizing radiation.

<Overcoat Layer Composition>

The overcoat layer composition may contain, in addition to an ionizing radiation-polymerizable compound, an air-dry curable resin, a thermosetting compound, a polymerization initiator, a solvent, and the like. The air-dry curable resin, the thermosetting compound, the polymerization initiator, the solvent, and the like are the same as the air-dry curable resin, the thermosetting compound, the polymerization initiator, the solvent, and the like described for the above-described spectral transmittance adjustment layer composition, and the description thereof is thus omitted here.

The light-transmitting functional layer 12 shown in FIG. 1 is composed of two layers, namely the spectral transmittance adjustment layer 13 and the overcoat layer 14, but a light-transmitting functional layer may comprise a spectral transmittance adjustment layer, an overcoat layer, and other light-transmitting functional layers, such as antifouling layer, provided on the surface of the overcoat layer which is opposite to the light-transmitting base material side surface. Additionally, in cases where a light-transmitting functional layer comprises no overcoat layer, the light-transmitting functional layer may comprise a spectral transmittance adjustment layer and other light-transmitting functional layers, such as antifouling layer, provided on the surface of the spectral transmittance adjustment layer which is opposite to the light-transmitting base material side surface. In these cases, the spectral transmittance adjustment layer and the overcoat layer are the same as the spectral transmittance adjustment layer 13 and the overcoat layer 14. The antifouling layer is a layer playing a role to prevent fouling (such as fingerprints, aqueous or oily inks, and pencil) or to enable easy removal of fouling by wiping on the outermost surface of each image display device with an optical film. Additionally, formation of the above-described antifouling layer can achieve improvement of antifouling and scratch resistant properties in resulting optical films.

The above-described antifouling layer contains, for example, an antifouling agent and a resin. The above-described antifouling agent is mainly for preventing fouling on the outermost surface of each optical film and can also provide scratch resistance to optical films.

Examples of the above-described antifouling agent include fluorine-based compounds, silicon-based compounds, and mixture compounds thereof. More specific examples of the above-described antifouling agent include silane coupling agents containing a fluoroalkyl group(s), such as 2-perfluoro-octylethyl-triaminosilane; particularly, antifouling agent containing an amino group(s) can preferably be used. The above-described resin is not limited to a particular resin but can be any of the aforementioned resins described in the section on the spectral transmittance adjustment layer 13.

The antifouling layer is preferably formed at the outermost surface. The above-described antifouling layer may be substituted by imparting antifouling properties to, for example, the spectral transmittance adjustment layer.

<<<Additional Optical Film>>>

Figure 3:
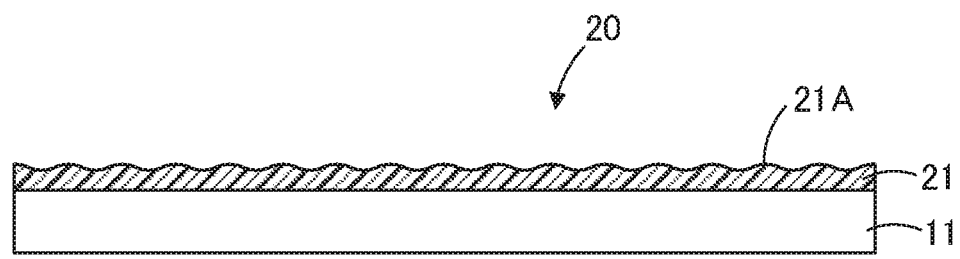
FIG. 3 depicts the schematic diagram of another optical film according to the embodiment.

The optical film may be an optical film 20 comprising, as shown in FIG. 3, a light-transmitting base material 11 and a light-transmitting functional layer 21 provided on one surface of the light-transmitting base material 11. By making the surface 21A of the light-transmitting functional layer 21 uneven, the optical film 20 can be imparted with, for example, antiglare and/or blocking resistance properties. The light-transmitting base material 11 in the optical film 20 is the same as the light-transmitting base material 11 described in the section on the optical film 10, and the description thereof is thus omitted here.

The physical properties of the optical film 20 are the same as those of the optical film 10. Therefore, the optical film 20 likewise has a spectral transmittance of less than 1% at a wavelength of 380 nm, a spectral transmittance of 10% or more and less than 60% at a wavelength of 410 nm, and a spectral transmittance of 70% or more at a wavelength of 440 nm.

<<Light-Transmitting Functional Layer>>

The light-transmitting functional layer 21 is a layer having a function for modifying the spectral transmittance of the optical film 20 and also having an antiglare function. The function of modifying the spectral transmittance in the light-transmitting functional layer 21 can be exerted by the above-described spectral transmittance modifier added to the light-transmitting functional layer. Additionally, the antiglare function in the light-transmitting functional layer 21 can be exerted by an uneven surface made as the surface 21A. For example, the surface 21 can be made uneven surface by adding an antiglare agent. The antiglare agent is not limited to a particular agent, and various known inorganic or organic particles may be used as the antiglare agent.

The above-described particles may be either globular or deformed particles. In this specification, the "globular particle" refers to, for example, a spherical or ellipsoidal particle, while the "deformed particle" refers to a particle with a randomly uneven surface as observed on potato tubers. In cases where the above-described particles are globular particles, spherical particles are preferred.

The average particle diameter of the above-described particles is not limited to a particular value but should generally be 0.01 µm or more and 20 µm or less. The average particle diameter of the above-described particles is defined as the arithmetical mean of the particle diameters of 20 particles, where the particle diameters of the 20 particles are measured from cross-sectional images of particles acquired using a scanning electron microscope (SEM), transmission electron microscope (TEM), or scanning transmission electron microscope (STEM). However, in cases where the particles are deformed particles, the particle diameter of each particle is defined as the average of the lengths of the maximum and minimum axes in each cross section.

The above-described particles exert antiglare properties and are preferably transparent. Specific examples of such fine particles include inorganic particles such as silica beads, and organic particles such as plastic beads.

Specific examples of the above-described plastic beads include styrene beads (with a refractive index of 1.60), melamine beads (with a refractive index of 1.57), acrylic beads (with a refractive index of 1.49), acrylic-styrene beads (with a refractive index of 1.54), polycarbonate beads, and polyethylene beads.

The light-transmitting functional layer 21 is preferred to satisfy the following inequalities (A-1) to (A-4), from the viewpoint of obtaining an optical film which will produce images with excellent brightness and contrast in bright and dark rooms by blurring only edges in an image reflected on the surface to secure antiglare properties and suitably transmitting an intended image while reducing generation of stray light by preventing significant diffusion of light, where the mean spacing between peaks, mean inclination angle, arithmetical mean roughness, and ten-points mean roughness of the surface 21A are respectively represented by Sm, θa, Ra, and Rz. In cases where Sm is less than the lower limit value of the following inequality (A-1), it may become difficult to control aggregation; additionally, in cases where Sm is more than the upper limit value of the following inequality (A-1), problems such as failure in detailed reproduction of images and consequent production of rough images may occur. Additionally, in cases where θa, Ra, and Rz are less than the lower limit values of the following inequalities (A-2) to (A-4), reflection of external light may not be inhibited. Additionally, in cases where θa, Ra, and Rz are more than the upper limit values of the following inequalities (A-2) to (A-4), reduction in image brightness due to reduced regularly transmitted light component, reduction in bright room contrast due to increased diffuse reflection of external light, and reduction in dark room contrast due to increased stray light from transmitted image light may occur.

$$50 \text{ µm} < Sm < 600 \text{ µm} \tag{A-1}$$

$$0.1° < \theta a < 1.5° \tag{A-2}$$

$$0.02 \text{ µm} < Ra < 0.30 \text{ µm} \tag{A-3}$$

$$0.30 \text{ µm} < Rz < 2.00 \text{ µm} \tag{A-4}$$

The surface 21A of the light-transmitting functional layer 21 is more preferred to satisfy the following inequalities (B-1) to (B-4), from the above-described viewpoint.

$$100 \text{ µm} < Sm < 400 \text{ µm} \tag{B-1}$$

$$0.1° < \theta a < 1.2° \tag{B-2}$$

$$0.02 \text{ µm} < Ra < 0.15 \text{ µm} \tag{B-3}$$

$$0.30 \text{ µm} < Rz < 1.20 \text{ µm} \tag{B-4}$$

The surface 21A of the light-transmitting functional layer 21 is further preferred to satisfy the following inequalities (C-1) to (C-4).

$$120 \text{ µm} < Sm < 300 \text{ µm} \tag{C-1}$$

$$0.1 < \theta a < 0.5° \tag{C-2}$$

$$0.02 \text{ µm} < Ra < 0.12 \text{ µm} \tag{C-3}$$

$$0.30 \text{ µm} < Rz < 0.80 \text{ µm} \tag{C-4}$$

Figure 4:
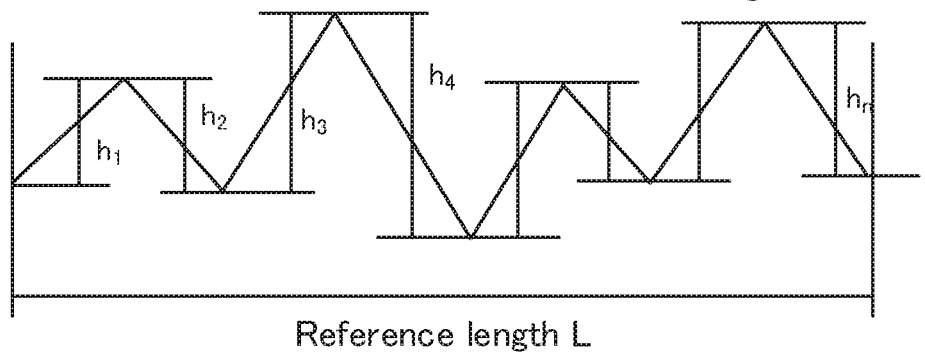
FIG. 4 explains a method for measurement of ea.

In this specification, the above-described Sm, Ra, and Rz are values determined by the method according to JIS B0601: 1994, and the above-described θa is a value determined in accordance with the definition described in the instruction (revised on Jul. 20, 1995) of a surface roughness measuring instrument, SE-3400 (manufactured by Kosaka Laboratory Ltd.), and is calculated as the arctangent of the sum of the heights of peaks $(h_1+h_2+h_3+ \ldots +h_n)$ divided by the reference length L: $\theta a = \tan^{-1}\{(h_1+h_2+h_3+ \ldots +h_n)/L\}$, which peaks are located; as shown in FIG. 4, along the reference length L. The Sm, θa, Ra, and Rz are defined as the arithmetical means of values measured at randomly selected three positions on the surface 21A of the light-transmitting functional layer 21, for example, using a surface roughness measuring instrument (product name "SE-3400"; manufactured by Kosaka Laboratory Ltd.), where no abnormalities (such as large foreign materials and scratches) are found at least by visual inspection. The measurement conditions in that case are the same as the measurement conditions for Ra in the surface 10A of the optical film 10. Additionally, the Ra can also be measured using an atomic force microscope (product name "WET-9100"; manufactured by Shimadzu Corporation), similarly to the Ra in the surface 10A of the optical film 10.

In cases where the light-transmitting functional layer 21 has blocking resistance properties, the light-transmitting functional layer 21 preferably contains, for example; an anti-blocking agent. Examples of the anti-blocking agent include oxides, such as aluminium oxide, magnesium oxide, silica, calcium oxide, titanium oxide, and zinc oxide; hydroxides, such as aluminium hydroxide, magnesium hydroxide, and calcium hydroxide; carbonate salts, such as magnesium carbonate and calcium carbonate; sulfate salts; such as calcium sulfate and barium sulfate; and silicate salts, such as magnesium silicate, aluminium silicate, calcium silicate, and aluminosilicate; and additionally include one, two or more inorganic compounds such as kaolin, talc, and diatom earth.

The average particle diameter of an inorganic compound-based anti-blocking agent is preferably 0.01 μm or more and 20 μm or less. In cases where the anti-blocking agent has an average particle diameter of less than 0.01 μm, the light-transmitting functional layer has low surface roughness and hardly gains an anti-blocking effect; additionally, in cases where the average particle diameter is more than 20 μm, the light-transmitting functional layer has very high surface roughness, which may cause generation of scars or the like due to friction of optical films gliding over each other.

The anti-blocking agent may be made from one or more raw materials selected from organic compounds consisting of, for example, fine powders of high-density polyethylene, ultra-high-molecular-weight polyethylene, polypropylene with a molecular weight of 300,000 or more, polycarbonate, polyimide, polyester, melamine resins, diallylphthalate resins, acrylic resins, and others.

The content of the anti-blocking agent is preferably 0.01 parts by mass or more and 6 parts by mass or less, more preferably 2 parts by mass or more and 5 parts by mass or less, relative to 100 parts by mass of a constituent resin of the light-transmitting functional layer. In cases where the content of the anti-blocking agent is less than 0.01 parts by mass, an uneven surface is insufficiently formed in the light-transmitting functional layer, which may in turn cause insufficient blocking resistance properties; additionally, in cases where the content of the anti-blocking agent is more than 6 parts by mass, the transparency of the light-transmitting functional layer may be reduced.

<<<Additional Optical Film>>>

Figure 5:
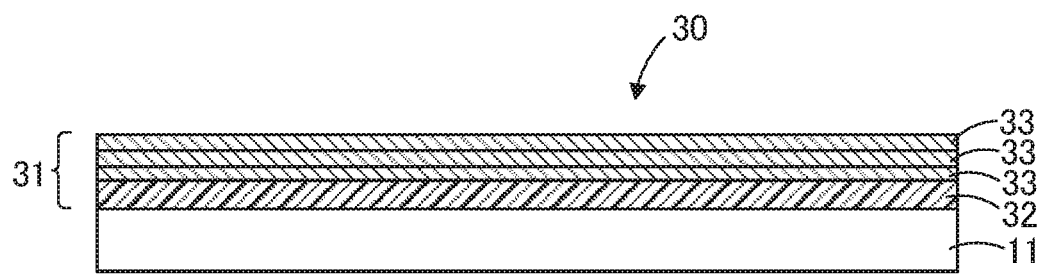
FIG. 5 depicts the schematic diagram of another optical film according to the embodiment.

The optical film may be an optical film 30 comprising, as shown in FIG. 5, a light-transmitting base material 11 and a light-transmitting functional layer 31 provided on one surface of the light-transmitting base material 11. The light-transmitting functional layer 31 comprises a spectral transmittance adjustment layer 32 and a laminate structure consisting of multiple deposition layers 33 that are provided on an opposite side to the light-transmitting base material 11 side in the spectral transmittance adjustment layer 32. The aforementioned requirements of spectral transmittance can be more properly satisfied by comprising the multiple deposition layers 33.

The physical properties of the optical film 30 are the same as those of the optical film 10. Therefore, the optical film 30 likewise has a spectral transmittance of less than 1% at a wavelength of 380 nm, a spectral transmittance of 10% or more and less than 60% at a wavelength of 410 nm, and a spectral transmittance of 70% or more at a wavelength of 440 nm.

<<Spectral Transmittance Adjustment Layer>>

The spectral transmittance adjustment layer 32 is similar to the spectral transmittance adjustment layer 13, and the description thereof is thus omitted here.

<<Deposition Layer>>

Each of the deposition layers 33 is preferably a deposition layer of, for example, an inorganic substance, such as silicon (Si), aluminium (Al), magnesium (Mg), calcium (Ca), potassium (K), tin (Sn), sodium (Na), boron (B), titanium (Ti), lead (Pb), zirconium (Zr), yttrium (Y), or niobium (Nb), or an inorganic oxide thereof. Among those, a deposition layer of silicon (Si) and niobium (Nb) is preferred.

The deposition layers 33 are preferably layers formed by sputtering. Because the above-described deposition layers are formed by sputtering, more precise control of film thickness can be achieved in deposition of those multiple thin film layers.

Preferably, the deposition layers 33 each have a film thickness of 3 nm or more and 150 nm or less and are stacked to form a laminate consisting of 5 layers or more and 20 layers or less. The presence of such deposition layers 33 on the spectral transmittance adjustment layer 32 allows the optical film 30 to prevent any coloration due to the deposition layers 33 and to more properly satisfy the aforementioned requirements of spectral transmittance. The film thickness of each deposition layer is defined as the arithmetical mean of film thickness values at 20 different locations, where cross-sectional images of the deposition layer are acquired using a scanning electron microscope (SEM), transmission electron microscope (TEM), or scanning transmission electron microscope (STEM) and the film thickness values at the 20 different locations on the deposition layer are measured from the resulting cross-sectional images.

A specific method of acquiring cross-sectional images is described below, for the case where a TEM or STEM is used to acquire cross-sectional images of a deposition layer, First of all, an optical film cut in a size of 1 mm×10 mm is embedded in an embedding resin to prepare a block, and homogeneous sections having a thickness of 70 nm or more and 100 nm or less and having no openings or the like are sliced from the block according to a commonly used sectioning technique. For the preparation of sections, an "Ultramicrotome EM UC7" (Leica Microsystems GmbH) or the like can be used. Then, the homogeneous sections with no openings or the like are used as measurement samples. Then, cross-sectional images of the measurement samples are acquired using a scanning transmission electron microscope (STEM) (product name "S-4800"; manufactured by Hitachi High-Technologies Corporation), The cross-sectional images are acquired using the above-described S-4800 by setting the detector to "TE," the accelerating voltage to "30 kV," and the emission current to "10 μA," The focus, contrast, and brightness are appropriately adjusted at a magnification of 5,000 to 200,000 times, so that each layer can be identified by observation. A preferred magnification ranges from 10,000 to 100,000 times, further preferably from 10,000 to 50,000 times, most preferably from 25,000 to 50,000 times. Furthermore, the beam monitor aperture, the objective lens aperture, and the WD may be respectively set to "3," "3," and "8 mm," in acquirement of cross-sectional images using the above-described S-4800. Additionally, because interfacial boundaries between layers become easily observed by application of a staining procedure with osmium tetraoxide, ruthenium tetraoxide, phosphotungstic acid, or the like, a staining process may be applied.

<<<Additional Optical Film>>>

Figure 6:
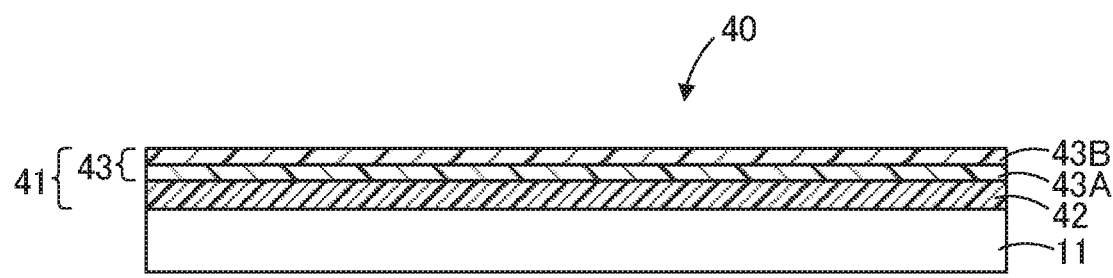
FIG. 6 depicts the schematic diagram of another optical film according to the embodiment.

The optical film may be an optical film 40 comprising, as shown in FIG. 6, a light-transmitting base material 11 and a light-transmitting functional layer 41 provided on one surface of the light-transmitting base material 11. The light-transmitting functional layer 41 preferably further comprises a spectral transmittance adjustment layer 42 and multiple invisible layers 43 that are provided on an opposite side to the light-transmitting base material 11 side in the spectral transmittance adjustment layer 42 and have mutually different refractive indexes. The optical film 40 is suitably used in image display devices equipped with touch panels, in each of which the presence of the invisible layers 43 can prevent observation of sensor electrodes (transparent electrode layer) made of an inorganic transparent conductive material, such as ITO.

The physical properties of the optical film 40 are the same as those of the optical film 10. Therefore, the optical film 40 likewise has a spectral transmittance of less than 1% at a wavelength of 380 nm, a spectral transmittance of 10% or more and less than 60% at a wavelength of 410 nm, and a spectral transmittance of 70% or more at a wavelength of 440 nm.

<<Spectral Transmittance Adjustment Layer>>

The spectral transmittance adjustment layer 42 is similar to the spectral transmittance adjustment layer 13, and the description thereof is thus omitted here.

<<Invisible Layer>>

The invisible layers 43 include, but are not particularly limited to, any conventionally known invisible layers, and preferably have a laminate structure consisting of, for example, a high refractive index layer 43A having a refractive index higher than that of the inorganic transparent conductive material and a low refractive index layer 43B having a refractive index lower than that of the high refractive index layer 43A. The invisible layers 43 may be provided on both surfaces of the light-transmitting base material 11.

<High Refractive Index Layer>

The high refractive index layer 43A preferably has a refractive index of 1.50 or more and 2.00 or less. The lower limit of the refractive index of the high refractive index layer 43A more preferably is 1.60 or more and the upper limit of the refractive index is 1.75 or less. In the method of measuring the refractive index of the high refractive index layer 43A, a portion of the high refractive index layer 43A is scraped off with, for example; cutter knife to prepare a powder sample, and the resulting powder sample is analyzed by the Becke Line method (in the method, reagents with known refractive indexes from Cargille Labs are used; one of the reagents is dropped on the powder sample placed on, for example, a slide glass to immerse the sample in the reagent and the resulting sample immersed in the reagent is observed by microscopy; the reagent is replaced by another reagent until a reagent that makes a bright line (Becke line) undetectable by visual inspection is found, which appears along the boundaries of the sample due to the difference in refractive index between the sample and the reagent, and the refractive index of the reagent is determined as the refractive index of the sample) according to the type B method (for transparent materials in powder or granular form) described in JIS K7142: 2008.

The high refractive index layer 43A preferably has a film thickness of 10 nm or more and 200 nm or less. The lower limit of the film thickness of the high refractive index layer 43A preferably is 30 nm or more and the upper limit of the film thickness more preferably is 100 nm or less. The film thickness of the high refractive index layer 43A should be determined by the same method as for those of the deposition layers 33.

The high refractive index layer 43A is not particularly limited as long as it has a refractive index higher than that of the aforementioned inorganic transparent conductive material, and is preferably composed of, for example, high-refractive-index fine particles and a binder resin.

Examples of the above-described high-refractive-index fine particles include metal oxide fine particles. The above-described metal oxide fine particles include, for example, titanium oxide ($TiO_2$; a refractive index of 2.3 to 2.7), niobium oxide ($Nb_2O_5$; a refractive index of 2.33), zirconium oxide ($ZrO_2$; a refractive index of 2,10), antimony oxide ($Sb_2O_5$; a refractive index of 2.04), tin oxide ($SnO_2$; a refractive index of 2.00), tin-doped indium oxide (ITO; a refractive index of 1.95 to 2.00), cerium oxide ($CeO_2$; a refractive index of 1.95), aluminium-doped zinc oxide (AZO; a refractive index of 1.90 to 2.00), gallium-doped zinc oxide (GZO; a refractive index of 1.90 to 2.00), zinc antimoniate ($ZnSb_2O_6$; a refractive index of 1.90 to 2.00), zinc oxide (ZnO; a refractive index of 1.90), yttrium oxide ($Y_2O_3$; a refractive index of 1.87), antimony-doped tin oxide (ATO; a refractive index of 1.75 to 1.85), and phosphorus-doped tin oxide (PTO; a refractive index of 1.75 to 1.85). Among those, zirconium oxide is preferred in terms of refractive index.

The constituent binder resin of the high refractive index layer 43A is not limited to a particular resin but is preferably a polymer (cross-linked substance) of a thermosetting resin, an ionizing radiation-polymerizable compound, or the like, for example, from the viewpoint of increasing the surface hardness, more preferably a polymer of an ionizing radiation-polymerizable compound, among others. Such binder resins include resins similar to the constituent resin component of the aforementioned spectral transmittance adjustment layer 13.

The high refractive index layer 43A can be formed, for example, by the same method as for the spectral transmittance adjustment layer 13. Specifically, in cases where the high refractive index layer 43A is formed, for example, on the surface of the spectral transmittance adjustment layer 42 which is opposite to the light-transmitting base material 11 side surface, it can be formed by applying a high refractive index layer composition containing at least high-refractive-index fine particles and a thermosetting resin or ionizing radiation-polymerizable compound to the surface of the spectral transmittance adjustment layer 42 to form a coating film, drying the coating film, and then curing the high refractive index layer composition by exposure to heat or ionizing radiation such as ultraviolet light.

<Low Refractive Index Layer>

The low refractive index layer 43B is a layer having a refractive index lower than that of the high refractive index layer 43A. The low refractive index layer 43B preferably has a refractive index of 1.35 or more and 1.55 or less. The lower limit of the refractive index of the low refractive index layer 43B more preferably is 1.40 or more and the upper limit of the refractive index is 1.50 or less. The refractive index of the low refractive index layer 43B should be determined by the same method as for the refractive index of the high refractive index layer 43A.

The low refractive index layer 43B preferably has a film thickness of 1 nm or more and 200 nm or less. The lower limit of the film thickness of the low refractive index layer 43B more preferably is 5 nm or more and the upper limit of the film thickness preferably is 100 nm or less. The film thickness of the low refractive index layer 43B should be determined by the same method as for those of the deposition layers 33.

Examples of the low refractive index layer 43B include a layer composed of low-refractive-index fine particles and a binder resin, and additionally include a layer composed of a low-refractive-index resin.

Examples of the above-described low-refractive-index fine particles include solid or hollow particles composed of silica or magnesium fluoride, and the like. Among those, hollow silica particles are preferred, and such hollow silica particles can be prepared, for example, by the production method described in Examples in Japanese Patent Application Publication No. 2005-099778.

The constituent binder resin of the low refractive index layer 43B includes resins similar to the constituent binder resin of the high refractive index layer 43A. However, the above-described binder resin may be mixed with a low-refractive-index material such as a fluorine-incorporated resin or an organopolysiloxane. Examples of the above-described low-refractive-index resin include resins having a low refractive index, such as fluorine-incorporated resins and organopolysiloxanes.

The low refractive index layer 43B can be formed, for example, by the same method as for the spectral transmittance adjustment layer 13. Specifically, the low refractive index layer 43B can be formed by first applying a low refractive index layer composition containing at least low-refractive-index fine particles and a thermosetting resin or ionizing radiation-polymerizable compound to the surface of the high refractive index layer 43A to form a coating film, drying the coating film, and then curing the low refractive index layer composition by exposure to heat or ionizing radiation such as ultraviolet light.

A medium refractive index layer may be provided between the high refractive index layer 43A and the low refractive index layer 43B, which has a refractive index lower than that of the high refractive index layer 43A and higher than that of the low refractive index layer 43B.

<<<Additional Optical Film>>>

Figure 7:
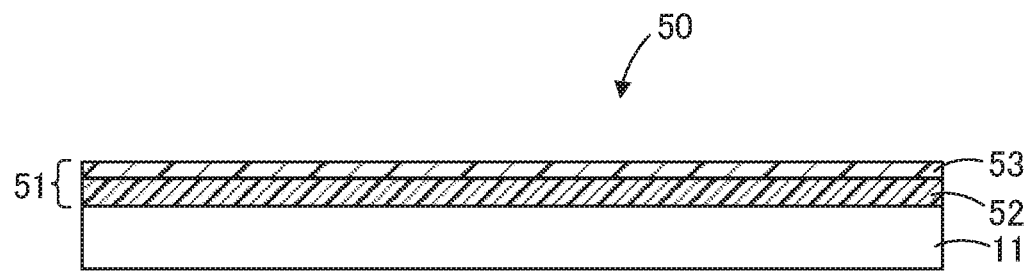
FIG. 7 depicts the schematic diagram of another optical film according to the embodiment.

The optical film may be an optical film 50 comprising, as shown in FIG. 7, a light-transmitting base material 11 and a light-transmitting functional layer 51 provided on one surface of the light-transmitting base material 11. The light-transmitting functional layer 51 preferably further comprises a spectral transmittance adjustment layer 52 and a low refractive index layer 53 that is provided on an opposite side to the light-transmitting base material 11 side in the spectral transmittance adjustment layer 52 and has a refractive index lower than that of the spectral transmittance adjustment layer 52. The presence of the low refractive index layer 53 in the optical film 50 can inhibit reflection of external light. Additionally, the optical film may further comprise a high refractive index layer between the spectral transmittance adjustment layer and the low refractive index layer, which has a refractive index higher than that of the spectral transmittance adjustment layer.

The physical properties of the optical film 50 are the same as those of the optical film 10. Therefore, the optical film 50 likewise has a spectral transmittance of less than 1% at a wavelength of 380 nm, a spectral transmittance of 10% or more and less than 60% at a wavelength of 410 nm, and a spectral transmittance of 70% or more at a wavelength of 440 nm.

<<Spectral Transmittance Adjustment Layer and Low Refractive Index Layer>>

The spectral transmittance adjustment layer 52 and the low refractive index layer 53 are similar to the spectral transmittance adjustment layer 13 and the low refractive index layer 43B, respectively, and the description thereof is thus omitted here.

The inventors intensively studied the yellow color problem associated with optical films and found that excessive absorption of light at a wavelength of around 410 nm by such an optical film causes the transmitted light through the optical film to be perceived as yellow. According to the embodiment, the optical films 10, 20, 30, and 40 have a spectral transmittance of less than 1% at a wavelength of 380 nm, a spectral transmittance of 10% or more and less than 60% at a wavelength of 410 nm, and a spectral transmittance of 70% or more at a wavelength of 440 nm, which consequently allows those optical films to absorb plenty of light in the wavelength range below 380 nm, not to excessively absorb light at a wavelength of around 410 nm but to transmit a moderate amount of light at the same wavelength, and to transmit plenty of light in the wavelength range above 440 nm. This enables shielding of blue light and reduction of yellow color in the optical films.

Additionally, to firmly attach members to each other through an adhesive layer, each adhesive layer is required to have a thickness of 10 µm or more, as described above. On the other hand, each of the light-transmitting functional layers 12, 21, 31, 41, and 51 comprises no adhesive layer and thus can have a film thickness of 9 µm or less, so that the thickness of each light-transmitting functional layer can be reduced to a thickness which is thinner than that achieved by adding a spectral transmittance modifier to an adhesive layer. This allows the optical films 10, 20, 30, 40, and 50 to become thinner. Additionally, image display devices can become thinner and lighter by the ability to make the optical films 10, 20, 30, 40, and 50 thinner.

The addition of a spectral transmittance modifier to an adhesive layer may cause deformation in the adherend or the like or result in failure to provide a desired size due to a change in thermal shrinkage ratio as well as a reduced adhesion strength. On the other hand, the optical films 10, 20, 30, 40, and 50 are not troubled with such problems because these films comprise no adhesive layers. Additionally, the optical films 10, 20, 30, 40, and 50 are easy to use because these films comprise no adhesive layers.

<<<Polarizing Plate>>>

Figure 8:
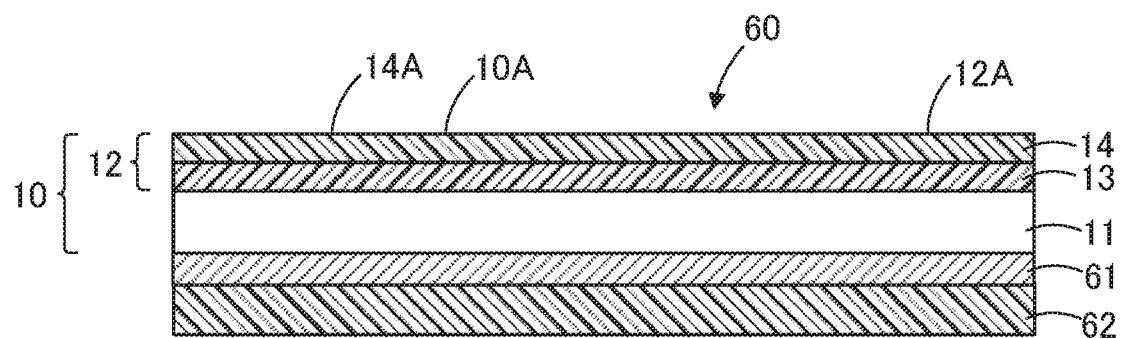
FIG. 8 depicts the schematic diagram of a polarizing plate according to the embodiment.

Each of the optical films 10, 20, 30, 40, and 50 can be incorporated into a polarizing plate for use. FIG. 8 depicts the schematic diagram of a polarizing plate according to the embodiment. As shown in FIG. 8, the polarizing plate 60 comprises an optical film 10, a polarizer 61, and a protective film 62, which are arranged in the recited order. Although an optical film 10 is used in the polarizing plate 60, an optical film 20, 30, 40, or 50 may be used instead of the optical film 10. Additionally, although the polarizer 61 in the polarizing plate 60 is provided on the light-transmitting base material 11 of the optical film 10, a polarizer may be provided on the light-transmitting functional layer of the optical film.

Bonding between the optical film 10 and the polarizer 61 and between the polarizer 61 and the protective film 62 is achieved with, for example, an aqueous adhesive or ultraviolet curable adhesive. The polarizing plate 60 may be a circularly polarizing plate. The polarizing plate 60 in the form of a circularly polarizing plate can cut light from external source when the circularly polarizing plate is used in image display devices comprising an organic light-emitting diode panel (OLED panel).

<<Polarizer>>

The polarizer 61 is provided on the surface of the light-transmitting base material 11 which is opposite to the light-transmitting functional layer 12 side surface. The polarizer 61 includes uniaxially stretched polyvinyl alcohol resin-based films stained with iodine or a dichromatic pigment. As the polyvinyl alcohol resin, saponified polyvinyl acetate resins can be used. Examples of the polyvinyl acetate resins include polyvinyl acetates as homopolymers of vinyl acetate, and copolymers of vinyl acetate and another monomer copolymerizable therewith. Examples of said another monomer copolymerizable with vinyl acetate include unsaturated carboxylic acids, olefins, vinyl ethers, unsaturated sulfonic acids, and acrylamides with an ammonium group. The polyvinyl alcohol resin may be a modified polyvinyl alcohol resin. For example, aldehyde-modified polyvinyl formal and polyvinyl acetal can also be used.

<<Protective Film>>

Examples of the protective film 62 include triacetylcellulose films (TAC films), (meth)acrylic resin films, and cycloolefin polymer films (COPs).

<<<Image Display Device>>>

Figure 9:
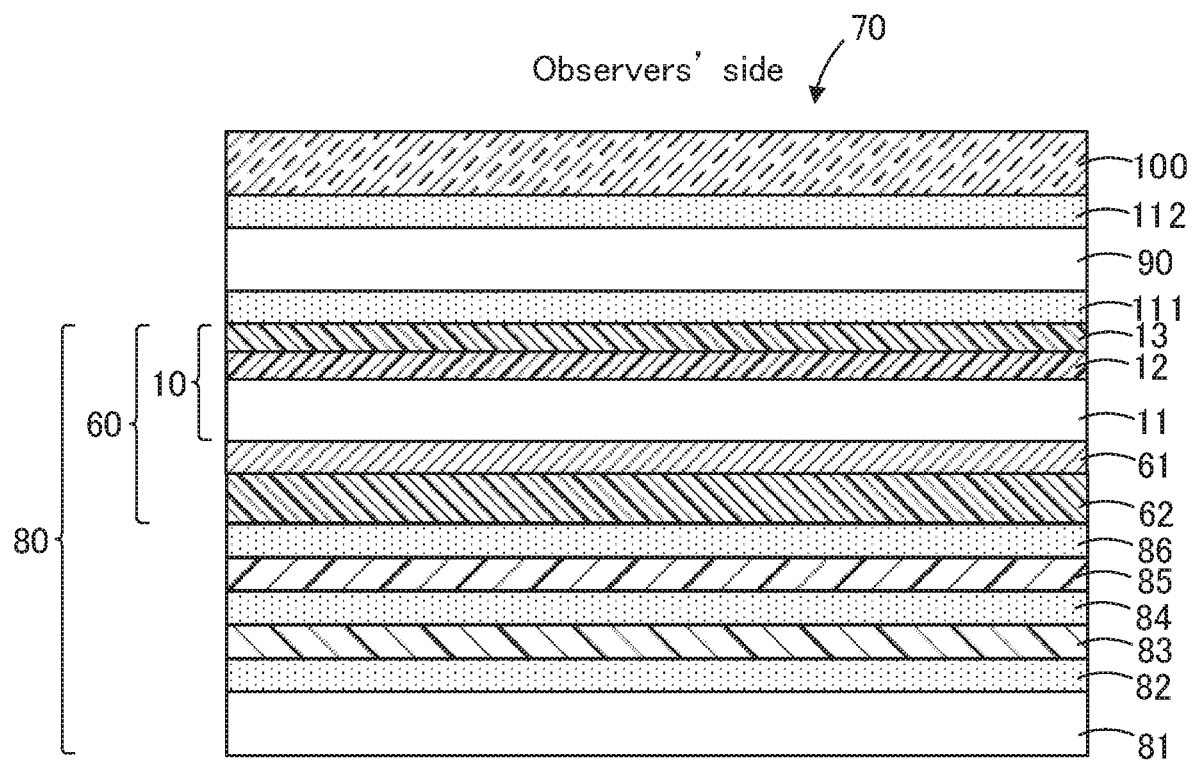
FIG. 9 depicts the schematic diagram of an image display device according to the embodiment.

Each of the optical films 10, 20, 30, 40, and 50 or the polarizing plate 60 can be incorporated into an image display device for use. FIG. 9 depicts the schematic diagram of an image display device according to the embodiment. As shown in FIG. 9, the image display device 70 comprises a display panel 80, a touch sensor 90 placed on the observer's side of the display panel 80, and a cover member 100 placed on the observer's side of the touch sensor 90 and configured to be a surface 70A of the image display device 70.

The display panel 80 mainly comprises a display element 81, an adhesion layer 82, a phase difference film 83, an adhesion layer 84, a λ/4 film 85, an adhesion layer 86, and a polarizing plate 60, which are arranged toward the observer's side in the recited order. The polarizing plate 60 is arranged to direct the optical film 10 to the observer's side. The display panel 80 has such a configuration because the display element 81 is an organic light-emitting diode (OLED) element. Although the image display device 70 comprises an optical film 10, an optical film 20, 30, 40, or 50 may be used instead of the optical film 10.

Although the display element 81 is an organic light-emitting diode (OLED), as described above, the display element may be a liquid crystal display element, inorganic light-emitting diode element, or quantum dot light-emitting diode (QLED). The adhesion layers 82 and 86 include, for example, adhesion layers composed of a pressure sensitive adhesive, and the adhesion layer 84 includes, for example, a cured product of a liquid ionizing radiation-curable adhesive (for example, OCR: optically clear resin) that contains an ionizing radiation-polymerizable compound.

As the touch sensor 90, any known touch sensor can be used. Although the touch sensor 90 is placed between the display panel 80 and the cover member 100, the touch sensor may be placed between the display element 81 and the phase difference film 83. The cover member 100 may be a cover glass or a cover film made of a light-transmitting resin.

Bonding between the display panel 80 and the touch sensor 90 and between the touch sensor 90 and the cover member 100 are respectively achieved by adhesion layers 111 and 112, which are made of a cured product of a pressure sensitive adhesive or ionizing radiation-curable adhesive. However, the interface between the display panel 80 and the touch sensor 90 and between the touch sensor 90 and the cover member 100 may be air layers (air gaps).

EXAMPLES

Now, the present invention will be described in more detail by way of examples below. However, the present invention is not limited to the description of those examples. Unless otherwise indicated in the text, "parts" and "%" are units expressed on a mass basis.

Example 1

(Synthesis of a Sesamol-Type Benzotriazole Monomer)

In a 200-mL four-neck flask equipped with a bulb condenser, a mercury thermometer, and an agitator, 4.0 g (0.013 mol) of 6-[5-(2-hydroxyethyl)-2H-benzotriazol-2-yl]benzo[1,3]dioxol-5-ol, 40 mL of toluene, 1.8 g (0.021 mol) of methacrylic acid, and 0.4 g (0.004 mol) of methanesulfonic acid were placed, and the resulting mixture was refluxed and dehydrated for 4 hours at 110 to 115° C. Then, 30 mL of water and 0.6 g (0.006 mol) of sodium carbonate were added, and the resulting mixture was left to stand to separate and remove the lower aqueous layer, and the remaining mixture was refluxed with stirring after addition of 0.2 g of activated charcoal to decolorize the mixture. After the resulting mixture was filtered, 40 mL of toluene was removed under reduced pressure from the filtrate, to which 100 mL of isopropyl alcohol was subsequently added to precipitate crystals. The crystals were filtrated, washed with 40 mL of isopropyl alcohol, and then dried under reduced pressure at 40° C. to give 4.2 g of yellow crystals. The 4.2 g of yellow crystals were washed with isopropyl alcohol by repulping washing, and then dried under reduced pressure at 40° C. to give 3.4 g of 2-[2-(6-hydroxybenzo[1,3]dioxol-5-yl)-2H-benzotriazol-5-yl]ethylmethacrylate as a sesamol-type benzotriazole monomer.

(Synthesis of an Acrylic Polymer Bound with the Sesamol-Type Benzatrizole Monomer)

In a four-neck flask equipped with a Dimroth condenser, a mercury thermometer, a nitrogen gas inlet tube, and an agitator, 8 parts by mass of the synthesized 2-[2-(6-hydroxybenzo[1,3]dioxol-5-yl)-2H-benzotriazol-5-yl]ethylmethacrylate, 32 parts by mass of methyl methacrylate (MMA) as another monomer, 20 parts by mass of toluene and 20 parts by mass of methyl ethyl ketone as solvents, and 0.6 parts by mass of 1,1'-azobis(cyclohexane-1-carbonitrile) as a polymerization initiator were placed. After the flask was purged for 1 hour with nitrogen gas at a flow rate of 10 mL/min with stirring the resulting mixture, the reaction mixture was refluxed for 10 hours at a temperature of 90 to 96° C. to carry out a polymerization reaction.

After completion of the polymerization reaction, 10 parts by mass of toluene and 10 parts by mass of MEK were added to the reaction mixture to give 100.6 parts by mass of a solution of an acrylic polymer (1) of the sesamol-type benzotriazole monomer bound with MMA and the ultraviolet absorber.

(Preparation of the Spectral Transmittance Adjustment Layer Composition 1)

A polyfunctional monomer (product name "KAYARAD PET-30"; manufactured by Nippon Kayaku Co., Ltd.) and the above-described acrylic polymer (1) were mixed in a mass ratio of 80:20 in terms of solid content, and diluted to a solid content of 25% with a solvent (a mixture of methyl ethyl ketone and toluene; mass ratio, 80:20) to prepare a resin composition. Then, 160 parts by mass of the obtained resin composition were mixed with 4 parts by mass of a polymerization initiator (a mixture of Omnirad 184 and Omnirad 819 manufactured by IGM Resins B.V. in a mass ratio of 50:50) and 0.2 parts by mass of a leveling agent (product name "F-568"; manufactured by DIC Corporation) with thorough stirring to prepare the spectral transmittance adjustment layer composition 1.

(Preparation of the Overcoat Layer Composition 1)

A polyfunctional monomer (product name "KAYARAD PET-30"; manufactured by Nippon Kayaku Co., Ltd.) was diluted to a solid content of 50% with a solvent (a mixture of methyl ethyl ketone and methyl isobutyl ketone; mass ratio, 50:50) to prepare a resin composition. Then, 200 parts by mass of the obtained resin composition were mixed with 4 parts by mass of a polymerization initiator (Omnirad 184 manufactured by IGM Resins B.V.) and 0.2 parts by mass of a leveling agent (product name "F-568"; manufactured by DIC Corporation) with thorough stirring to prepare the overcoat layer composition.
(Manufacture of an Optical Film)

The obtained spectral transmittance adjustment layer composition 1 was applied with a Mayer bar to a surface of a triacetylcellulose base material having a size of 210 mm×297 mm (A4 size) and a thickness of 25 µm to form a coating film. Then, dry air at 50° C. was blown at a flow rate of 0.5 m/s over the formed coating film for 30 seconds to evaporate the solvent in the coating film, and the resulting coating film was cured by exposure to ultraviolet light to a cumulative light dose of 200 mJ/cm² to form a spectral transmittance adjustment layer having a film thickness of 5 µm.

After forming the spectral transmittance adjustment layer, the overcoat layer composition 1 was applied with a Mayer bar to a surface of the spectral transmittance adjustment layer to form a coating film. Then, dry air at 70° C. was blown at a flow rate of 0.5 m/s over the formed coating film for 30 seconds to evaporate the solvent in the coating film, and the resulting coating film was cured by exposure to ultraviolet light to a cumulative light dose of 200 mJ/cm² to form an overcoat layer having a film thickness of 4 µm. Thus, an optical film comprising a light-transmitting functional layer with a film thickness of 9 µm, which consisted of the spectral transmittance adjustment layer (SA layer) with a film thickness of 5 µm and the overcoat layer (OC layer) with a film thickness of 4 µm, provided on a triacetylcellulose base material was obtained. The film thickness of the spectral transmittance adjustment layer was defined as the arithmetical mean of film thickness values at 20 different locations, where cross-sectional images of the spectral transmittance adjustment layer were acquired using a scanning electron microscope (SEM) and the film thickness values at the 20 different locations on the spectral transmittance adjustment layer were measured from the resulting cross-sectional image. Specifically, the method of acquiring cross-sectional images was as follows. First of all, the optical film cut in a size of 1 mm×10 mm was embedded in an embedding resin to prepare a block, and homogeneous sections having a thickness of around 70 nm to 300 nm and having no openings or the like were sliced from the block according to a commonly used sectioning technique. For the preparation of sections, an "Ultramicrotome EM UC7" (Leica Microsystems GmbH) or the like was used. Then, the block remaining after slicing the homogeneous sections with no openings or the like was used as a measurement sample. Then, cross-sectional images of the measurement sample were acquired using a scanning electron microscope (SEM) (product name "S-4800"; manufactured by Hitachi High-Technologies Corporation). The cross-sectional images were acquired using the above-described S-4800 by setting the detector to "SE," the accelerating voltage to "5 kV," and the emission current to "10 µA." The focus, contrast, and brightness were appropriately adjusted at a magnification in the range of 1,000 to 10,000 times depending on the film thickness of the light-transmitting functional layer, so that each layer was able to be identified by observation. Specifically, to reduce any variation in measured film thicknesses, the magnification was adjusted to 2,000 times for a film thickness of 9 µm and in the range of 2,000 to 5,000 times for a film thickness of 5 µm in the light-transmitting functional layer. Furthermore, the beam monitor aperture was set to "1", the objective lens aperture was set to "2", and the WD was set to "8 mm". Additionally, the film thickness of the overcoat layer was also measured by the same method as for the film thickness of the spectral transmittance adjustment layer. Furthermore, also in Examples 2 to 5 and Comparative Examples 1 to 3, the film thicknesses of a spectral transmittance adjustment layer and an overcoat layer were measured by the same methods as in Example 1.

Example 2

In Example 2, an optical film was obtained in the same manner as in Example 1, except that the mass ratio of the above-described polyfunctional monomer and the above-described acrylic polymer (1) was changed to 67:33 in terms of solid content.

Example 3

In Example 3, an optical film was obtained in the same manner as in Example 1, except that the mass ratio of the above-described polyfunctional monomer and the above-described acrylic polymer (1) was changed to 50:50 in terms of solid content.

Example 4

In Example 4, an optical film was obtained in the same manner as in Example 1, except that the film thickness of the spectral transmittance adjustment layer was changed to 2 µm.

Example 5

(Preparation of the Spectral Transmittance Adjustment Layer Composition 2)

A polyester resin (product name "VYLON 24SS"; manufactured by Toyobo Co., Ltd.) was diluted to a solid content of 25% with methyl ethyl ketone to prepare a resin composition. Then, 120 parts by mass of the obtained resin composition were mixed with 4 parts by mass of a polymerization initiator (a mixture of Omnirad 184 and Omnirad 819 manufactured by IGM Resins B.V. in a mass ratio of 50:50), 3 parts by mass of an indole compound (product name "BONASORB UA-3912"; manufactured by Orient Chemical Industries Co., Ltd.), 5 parts by mass of a benzotriazole compound (product name "JF-79"; manufactured by Johoku Chemical Co., Ltd.), and 0.2 parts by mass of a leveling agent (product name "F-568"; manufactured by DIC Corporation) with thorough stirring to prepare the spectral transmittance adjustment layer composition 2.
(Manufacture of an Optical Film)

The obtained spectral transmittance adjustment layer composition 2 was applied with a Mayer bar to a surface of a triacetylcellulose base material having a size of 210 mm×297 mm (A4 size) and a thickness of 25 µm to form a coating film. Then, dry air at 50° C. was blown at a flow rate of 0.5 m/s over the formed coating film for 30 seconds to evaporate the solvent in the coating film, and the resulting coating film was cured by exposure to ultraviolet light to a cumulative light dose of 50 mJ/cm² to form a spectral transmittance adjustment layer having a film thickness of 5 µm. Thus, an optical film comprising a light-transmitting functional layer, which consisted of only the spectral transmittance adjustment layer (SA layer) with a film thickness of 5 µm, provided on a triacetylcellulose base material was obtained.

Comparative Example 1

In Comparative Example 1, an optical film was obtained in the same manner as in Example 1, except that the mass ratio of the above-described polyfunctional monomer and the above-described acrylic polymer (1) was changed to 90:10 in terms of solid content.

Comparative Example 2

(Preparation of the Spectral Transmittance Adjustment Layer Composition 3)

A polyfunctional monomer (product name "KAYARAD PET-30"; manufactured by Nippon Kayaku Co., Ltd.) was diluted to a solid content of 25% with a solvent consisting of methyl ethyl ketone and methyl isobutyl ketone in a mass ratio of 50:50 to prepare a resin composition. Then, 400 parts by mass of the obtained resin composition were mixed with 4 parts by mass of a polymerization initiator (a mixture of Omnirad 184 and Omnirad 819 manufactured by IGM Resins B.V. in a mass ratio of 50:50), 3 parts by mass of an indole compound (product name "BONASORB UA-3912"; manufactured by Orient Chemical Industries Co., Ltd.), and 0.2 parts by mass of a leveling agent (product name "F-568"; manufactured by DIC Corporation) with thorough stirring to prepare the spectral transmittance adjustment layer composition 3.

(Manufacture of an Optical Film)

An optical film comprising a light-transmitting functional layer, which consisted of only a spectral transmittance adjustment layer (SA layer) with a film thickness of 5 µm, provided on a triacetylcellulose base material was obtained in the same manner as in Example 5, except that the obtained spectral transmittance adjustment layer composition 3 was used.

Comparative Example 3

(Preparation of the Spectral Transmittance Adjustment Layer Composition 4)

A polyfunctional monomer (product name "KAYARAD PET-30"; manufactured by Nippon Kayaku Co., Ltd.) was diluted to a solid content of 25% with a solvent consisting of methyl ethyl ketone and methyl isobutyl ketone in a mass ratio of 50:50 to prepare a resin composition. Then, 400 parts by mass of the obtained resin composition were mixed with 4 parts by mass of polymerization initiator (a mixture of Omnirad 184 and Omnirad 819 manufactured by IGM Resins B.V. in a mass ratio of 50:50), 7 parts by mass of a benzotriazole compound (product name "JF-79"; manufactured by Johoku Chemical Co., Ltd.), and 0.2 parts by mass of a leveling agent (product name "F-568"; manufactured by DIC Corporation) with thorough stirring to prepare the spectral transmittance adjustment layer composition 4.

(Manufacture of an Optical Film)

The obtained spectral transmittance adjustment layer composition 4 was applied with a Mayer bar to a surface of a triacetylcellulose base material having a size of 210 mm×297 mm (A4 size) and a thickness of 25 µm to form a coating film. Then, dry air at 50° C. was blown at a flow rate of 0.5 m/s over the formed coating film for 30 seconds to evaporate the solvent in the coating film, and the resulting coating film was cured by exposure to ultraviolet light to a cumulative light dose of 200 mJ/cm² to form a spectral transmittance adjustment layer having a film thickness of 8 µm. Thus, an optical film comprising a light-transmitting functional layer, which consisted of only the spectral transmittance adjustment layer (SA layer) with a film thickness of 8 µm, provided on a triacetylcellulose base material was obtained.

<Spectral Transmittance>

Figure 10:
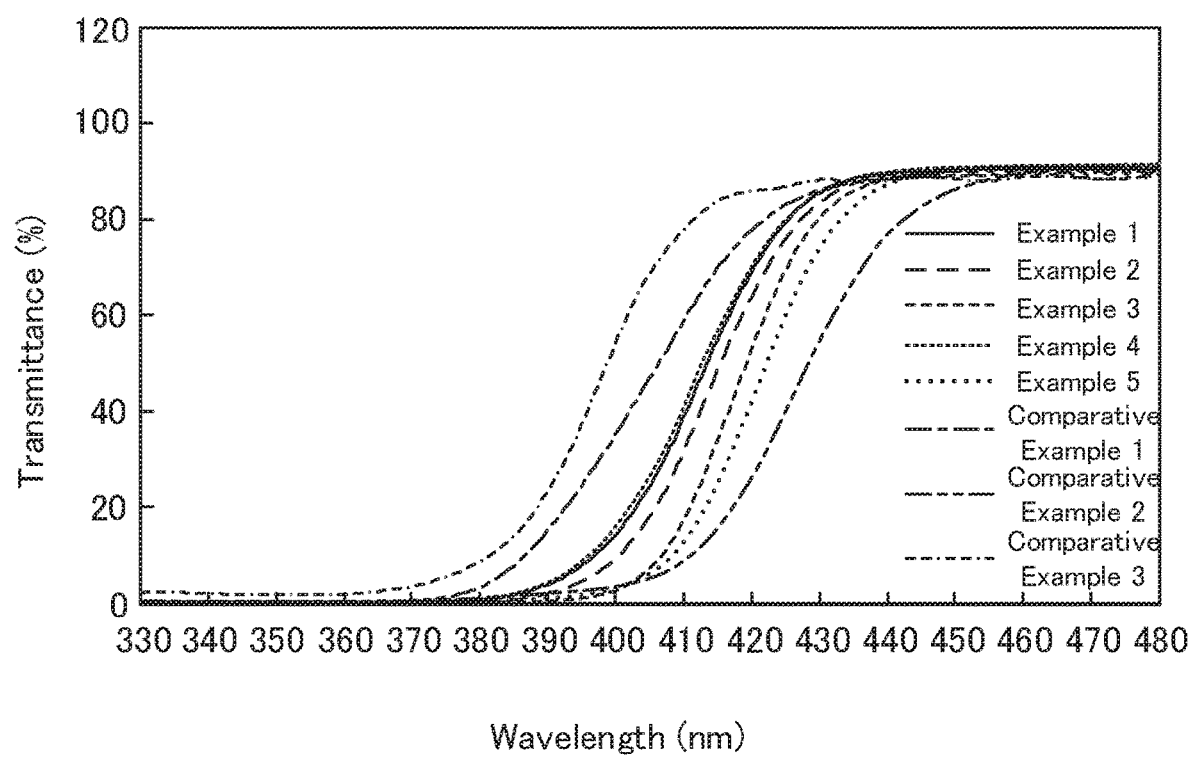
FIG. 10 depicts a graph illustrating the transmittance spectra of optical films according to Examples and Comparative Examples.

In the optical films according to Examples and Comparative Examples, the spectral transmittance was measured at wavelengths of 380 nm, 410 nm, 420 nm, and 440 nm. Specifically, the optical film cut in a size of 50 mm×50 mm was placed into a spectrophotometer capable of measuring the transmittance at 0.5% of pitch (product name "UV-2450"; manufactured by Shimadzu Corporation; light source: tungsten and deuterium lamps) in such a manner that the base material of the optical film faced toward the light source. The above optical film, which had no defect (no contamination of any extraneous substance), no crack, no wrinkle, and no fouling deposition, and was also kept flat without curls, was held in the spectrophotometer. In this configuration, the transmittance was measured at minimally five points spanning a 1 nm range centered at each wavelength of 380 nm, 410 nm, 420 nm, and 440 nm under the following measurement conditions, and the averages of the values were calculated to determine the spectral transmittances at wavelengths of 380 nm, 410 nm, 420 nm, and 440 nm. The arithmetical means of three measurements each at wavelengths of 380 nm, 410 nm, 420 nm, and 440 nm were determined as the spectral transmittances at the wavelengths. A graph illustrating the transmittance spectra according to Examples 1 to 5 and Comparative Examples 1 to 3 is shown in FIG. 10.

(Measurement Conditions)

Wavelength range: 300 nm to 780 nm
Scan speed: high
Slit width: 2.0
Sampling interval: auto (an interval of 0.5 nm)
Illumination: C
Light source: D2 and WI
Visual field: 2°
Light source switching wavelength: 360 nm
S/R switching: standard
Detector: PM
Auto-zero: performed at 550 nm after baseline scan.

<Blue Light Cut-Off (Shielding) Rate>

The blue light cut-off rate (BL cut-off rate) was measured in the optical films according to Examples and Comparative Examples. Specifically, the optical film cut in a size of 50 mm×50 mm was placed into a spectrophotometer capable of measuring the transmittance at 0.5% of pitch (product name "UV-2450"; manufactured by Shimadzu Corporation; light source: tungsten and deuterium lamps) in such a manner that the base material of the optical film faced toward the light source, in accordance with WS T7333: 2005. The optical film was held in the spectrophotometer without any fault (without contamination of any extraneous substance), any crack, any wrinkle, and any fouling deposition, and also in a flat configuration without any curling. In this configuration, the transmittance was measured at minimally five points spanning a 1 nm range centered at each wavelength in the wavelength range from 380 nm to 495 nm, and the averages of the values were calculated to determine the spectral transmittances in the wavelength range from 380 nm to 495 nm. Then, the blue light cut-off rate was determined with the following equation, where A represents the blue light cut-off rate (%) and B represents the mean transmittance (%) in the wavelength range from 380 nm to 495 nm. The arithmetical mean of three measurements was determined as the blue light cut-off rate. Additionally, the conditions for measuring the spectral transmittance were the same as the above-described conditions for measuring the spectral transmittance at wavelengths of 380 nm, 410 nm, and 440 nm.

$$A = 100 - B$$

<Yellow Index (YI), Color Coordinate a*, and Color Coordinate b*>

The yellow index, the color coordinate a*, and the color coordinate b* were measured in the optical films according to Examples and Comparative Examples. Specifically, the optical film cut in a size of 50 mm×50 mm was first placed into a spectrophotometer (product name "UV-2450"; manufactured by Shimadzu Corporation; light source: tungsten and deuterium lamps) in such a manner that the base material of the optical film faced toward the light source. The optical film was held in the spectrophotometer without any fault (without contamination of any extraneous substance), any crack, any wrinkle, and any fouling deposition, and also in a flat configuration without any curling. In this configuration, the transmittance was measured in the wavelength range from 300 nm to 780 nm. The values of "YI," "a*," and "b*" were calculated from the loaded measurement data of the above-described transmittance on a monitor screen connected to the UV-2450, where the calculation started with selecting the "YI," "a*," and "b*" items from the calculation menu. The conditions for measuring the transmittance in the wavelength range from 300 nm to 780 nm were the same as the above-described conditions for measuring the spectral transmittance at wavelengths of 380 nm, 410 nm, and 440 nm.

<The Slope of the Transmittance Spectrum in the Wavelength Range from 410 nm to 420 nm>

In the optical films according to Examples and Comparative Examples, the slope of the transmittance spectrum in the wavelength range from 410 nm to 420 nm was determined. Specifically, the optical film cut in a size of 50 mm×50 mm was placed into a spectrophotometer capable of measuring the transmittance at 0.5% of pitch (product name "UV-2450"; manufactured by Shimadzu Corporation; light source: tungsten and deuterium lamps) in such a manner that the base material of the optical film faced toward the light source. The optical film was held in the spectrophotometer without any fault (without contamination of any extraneous substance), any crack, any wrinkle, and any fouling deposition, and also in a flat configuration without any curling. In this configuration, the transmittance was measured at minimally five points spanning a 1 nm range centered at each wavelength in the wavelength range from 410 nm to 420 nm, and the averages of the values were calculated to determine the spectral transmittances in the wavelength range from 410 nm to 420 nm for each optical film. Then, the slope of the transmittance spectrum as a function of wavelength in the wavelength range from 410 nm to 420 nm was obtained by applying the least square method to the determined spectral transmittances. The arithmetical mean of three measurements was determined as the value of the slope. Additionally, the conditions for measuring the spectral transmittance were the same as the above-described conditions for measuring the spectral transmittance at wavelengths of 380 nm, 410 nm, and 440 nm.

<Indentation Hardness>

The indentation hardness of a spectral transmittance adjustment layer was measured in each of the optical films according to Examples and Comparative Examples. The indentation hardness was measured using a "TI950 TriboIndenter" manufactured by Hysitron, Inc. Specifically, the optical film cut in a size of 1 mm×10 mm was first embedded in an embedding resin to prepare a block, from which measurement samples suitable for the hardness test by the nanoindentation technique were prepared. For the preparation of measurement samples, a "Ultramicrotome EM UC7" (Leica Microsystems GmbH) was used. Then, it was confirmed whether or not the interfacial boundary between the spectral transmittance adjustment layer and the overcoat layer was clearly detected by observing a cross-section of such a measurement sample under a scanning electron microscope (SEM). Then, the measurement sample was fixed on the stage of a TI950 TriboIndenter manufactured by Hysitron, Inc., in such a manner that a surface of the measurement sample to which an indenter was to be pressed was arranged parallel to the top surface of the stage. A Berkovich indenter was pressed at a rate of 10 nm/s with a maximum indentation load of 300 μN according to the load control procedure into a measurement position within a central planar portion of the spectral transmittance adjustment layer in cases where the interfacial boundary between the spectral transmittance adjustment layer and the overcoat layer was clearly detected by SEM observation, or a measurement position within a central planar portion of the light-transmitting functional layer in cases where the interfacial boundary between the spectral transmittance adjustment layer and the overcoat layer was not clearly detected, held with the maximum load for five seconds, and then unloaded at the same rate. Then, the indentation depth h (nm) corresponding to this indentation load F (μN) was continuously measured to prepare a load-displacement curve, and the hardness was determined as a value calculated by dividing the maximum indentation load $F_{max}$ (N) by the projected area $A_p$ (mm$^2$) of contact of the indenter with the spectral transmittance adjustment layer, which was computed from the prepared load-displacement curve. The above-described $A_p$ was defined as a projected area of contact obtained by applying a correction to the indenter tip radius according to the standard method of the instrument. The arithmetical mean of obtained values from the measurement at 10 different positions was determined as the indentation hardness.

<Flexibility>

A mandrel test was carried out in accordance with JIS K5600-5-1: 1999 to evaluate the flexibility in Examples and Comparative Examples. Specifically, the optical film cut in a size of 100 mm×25 mm was wrapped around a stainless rod with a diameter of 2 mm in such a manner that the light-transmitting functional layer faced outward and the longer edges of the optical film faced to each other. The optical film was held in this configuration for 5 seconds and then unwound to examine whether any crack was formed along the short-side direction in a portion of the optical film which had had contact with the stainless rod. Additionally, the mandrel test was carried out under the same conditions as described above, except that the light-transmitting functional layer of each optical film faced inward, to examine whether any crack was formed in the short-side direction in a portion of the optical film which had had contact with the stainless rod. The evaluation results were based on the following evaluation criteria:

○: no crack in the optical film was detected in both the mandrel tests;

×: any crack in the optical film was detected in either of the mandrel tests.

<Evaluation of Degradation of Display Panels>

A light resistance test was carried out on samples consisting of the optical films according to Examples and Comparative Examples each placed on an organic light-emitting diode panel (OLED panel) to evaluate whether or not degradation would occur in the OLED panels. Specifically, each sample was prepared by placing the optical film cut in a size of 50 mm×50 mm on the OLED panel of a smartphone (product name "Galaxy S7"; manufactured by Samsung Electronics Co., Ltd.). Then, the brightness of light emitted from the OLED panel and then transmitted through the optical film in this sample was measured in the thickness direction of the optical film using a spectroradiometer (product name "CS-2000"; manufactured by Konica Minolta, Inc.) with selecting a measurement angle of 1°. Subsequently, this sample was placed into a light resistance testing device (product name "UV Fade Meter U48AU"; manufactured by Suga Test Instruments Co., Ltd.) to perform a light resistance test, in which the surface of the optical film was exposed to light from a carbon arc lamp in an environment at a temperature of 42° C. and a relative humidity of 50% for 50 hours. Then, the sample was recovered from the light resistance testing machine and the brightness of light emitted from the OLED panel and transmitted through the optical film in the sample after the light resistance test was measured in the thickness direction of the optical film using the spectroradiometer (product name "CS-2000"; manufactured by Konica Minolta, Inc.) with selecting a measurement angle of 1°. The brightness maintenance rate as the ratio of the brightness after the light resistance test to the brightness before the light resistance test was determined from the measured brightness values. The brightness maintenance rate was determined with the following equation, where A represents the brightness maintenance rate, B represents the brightness of light emitted from a sample before the light resistance test, and C represents the brightness of light emitted from the same sample after the light resistance test.

$$A = C/B \times 100$$

By the obtained brightness maintenance rate, it was examined whether or not the OLED panel had been degraded by the light resistance test. Specifically, a brightness maintenance rate of less than 80% was judged as indicating degradation of an OLED panel and a brightness maintenance rate of 80% or more was judged as indicating the absence of degradation of an OLED panel. The evaluation criteria are as follows:

○: any degradation was not detected in an OLED panel;
x: any degradation was detected in an OLED panel.

The results are shown in Tables 1 and 2 below.

TABLE 1

| | Film thickness of a light-transmitting functional layer (μm) | | | Spectral transmittance (%) | | | | BL cut-off rate (%) | YI |
|---|---|---|---|---|---|---|---|---|---|
| | SA layer | OC layer | Total | 380 nm | 410 nm | 420 nm | 440 nm | | |
| Example 1 | 5 | 4 | 9 | 0.7 | 38.9 | 69.6 | 89.6 | 34 | 3.5 |
| Example 2 | 5 | 4 | 9 | 0.3 | 31.6 | 64.0 | 89.4 | 36 | 4.6 |
| Example 3 | 5 | 4 | 9 | 0.0 | 17.5 | 53.0 | 88.3 | 40 | 6.6 |
| Example 4 | 2 | 4 | 6 | 0.7 | 41.6 | 70.7 | 90.1 | 33 | 3.9 |
| Example 5 | 5 | 0 | 5 | 0.2 | 12.8 | 42.2 | 87.3 | 41 | 7.7 |
| Comparative Example 1 | 5 | 4 | 9 | 3.5 | 59.0 | 76.9 | 88.6 | 29 | 3.7 |
| Comparative Example 2 | 6 | 0 | 6 | 0.8 | 8.6 | 26.0 | 76.7 | 46 | 14.3 |
| Comparative Example 3 | 8 | 0 | 8 | 23.1 | 77.6 | 85.7 | 87.8 | 26 | 2.8 |

TABLE 2

| | a* | b* | Slope | Indentation hardness (MPa) | Evaluation of flexibility | Evaluation of panel degradation |
|---|---|---|---|---|---|---|
| Example 1 | -1.93 | 2.47 | 3.0 | 343 | ○ | ○ |
| Example 2 | -1.59 | 2.92 | 3.2 | 320 | ○ | ○ |
| Example 3 | -1.79 | 4.09 | 3.6 | 280 | ○ | ○ |
| Example 4 | -1.27 | 2.43 | 2.9 | 292 | ○ | ○ |
| Example 5 | -2.84 | 5.14 | 2.9 | 125 | ○ | ○ |
| Comparative Example 1 | -0.77 | 2.12 | 1.9 | 363 | ○ | x |
| Comparative Example 2 | -5.40 | 9.88 | 1.7 | 420 | x | ○ |
| Comparative Example 3 | -0.04 | 1.31 | 0.8 | 402 | x | x |

As shown in Table 1, the optical films according to Comparative Examples 1 to 3 failed to satisfy the following requirements of spectral transmittance: a spectral transmittance of less than 1% at a wavelength of 380 nm, a spectral transmittance of 10% or more and less than 60% at a wavelength of 410 nm, and a spectral transmittance of 70% or more at a wavelength of 440 nm, and thus had poor blue light cut-off (shielding) rates and/or failed to reduce yellow color in the optical films even though reduction in film thickness was achieved in those optical films. Because the value of YI is affected by the range of wavelengths to be cut off, the YI can be modified to some extent by changing the type and ratio of an added spectral transmittance modifier. Therefore, the optical films according to Comparative Examples 1 and 3 exhibited low YI values but had high spectral transmittances at 410 nm and poor blue light cut-off rates. Additionally, although a spectral curve is preferred to show a sharp rise in the visible light range (a steep slope of the transmittance spectrum in the wavelength range from 410 to 420 nm) for reducing the value of YI, the slope of the transmittance spectrum in the wavelength range from 410 nm to 420 nm is small in the optical film according to Comparative Example 2, which is considered to be a cause of the high YI value.

On the other hand, the optical films according to Examples 1 to 5 satisfied the following requirements of spectral transmittance: a spectral transmittance of less than 1% at a wavelength of 380 nm, a spectral transmittance of 10% or more and less than 60% at a wavelength of 410 nm, and a spectral transmittance of 70% or more at a wavelength of 440 nm, and thus had an excellent blue light cut-off (shielding) rates and reduced yellow color in the optical films, even though reduction in film thickness was achieved in those optical films.

LIST OF REFERENCE NUMERALS 10, 20, 30, 40, 50: Optical film
11: Light-transmitting base material
12, 21, 31, 41, 51: Light-transmitting functional layer
13, 32, 42, 52: Spectral transmittance adjustment layer
14: Overcoat layer
33: Deposition layer
43: Invisible layer
43A: High refractive index layer
43B: Low refractive index layer
50: Polarizing plate
51: Polarizer
60: Image display device
70: Display panel
71: Display element

The invention claimed is:

1. An optical film comprising a light-transmitting base material and a light-transmitting functional layer provided on one surface of the light-transmitting base material, wherein the optical film has
   a spectral transmittance of less than 1% at a wavelength of 380 nm,
   a spectral transmittance of more than 10% and less than 60% at a wavelength of 410 nm, and
   a spectral transmittance of 70% or more at a wavelength of 440 nm, and
   wherein the light-transmitting functional layer has a film thickness of 9 μm or less.

2. The optical film according to claim 1, wherein the optical film has a yellow index of 1 or more and 12 or less.

3. The optical film according to claim 1, wherein the optical film has a blue light shielding rate of 30% or more.

4. The optical film according to claim 1, wherein a slope of the transmittance spectrum obtained by applying a least square method to the transmittance in the wavelength range from 410 nm to 420 nm is 2 or more.

5. The optical film according to claim 1, wherein the light-transmitting functional layer comprises a spectral transmittance adjustment layer that contains a resin and a spectral transmittance modifier.

6. A polarizing plate comprising
   the optical film according to claim 1, and
   a polarizer provided on one surface of the optical film.

7. An image display device comprising
   a display element, and
   the optical film according to claim 1 placed on the observer's side of the display element.

8. The image display device according to claim 7, wherein the display element is an organic light-emitting diode display element.

9. An image display device comprising
   a display element, and
   the polarizing plate according to claim 6 placed on the observer's side of the display element.

10. The optical film according to claim 1, wherein the optical film has the spectral transmittance of 13% or more and less than 60% at a wavelength of 410 nm.

11. The optical film according to claim 1, wherein the optical film has a spectral transmittance of 45% or more and 70% or less at a wavelength of 420 nm.

* * * * *